(12) United States Patent
Wada et al.

(10) Patent No.: US 6,420,783 B2
(45) Date of Patent: Jul. 16, 2002

(54) SEMICONDUCTOR DEVICE AND A METHOD OF MANUFACTURING THE SAME

(75) Inventors: Takashi Wada, Kodaira; Takuji Ide, Higashimurayama; Eiji Niihara; Shunichiro Fujioka, both of Hinode; Mitsue Ueno, Hamura, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/799,548

(22) Filed: Mar. 7, 2001

(30) Foreign Application Priority Data

Mar. 23, 2000 (JP) .................................... 2000-082724

(51) Int. Cl.[7] .............................................. H01L 23/34
(52) U.S. Cl. ...................... 257/724; 257/676; 257/777
(58) Field of Search .............................. 257/80, 81, 82, 257/676, 777

(56) References Cited

U.S. PATENT DOCUMENTS 6,265,763 B1 * 7/2001 Jao et al. ..................... 257/676
6,285,084 B1 * 9/2001 Hikita et al. ................. 257/777

FOREIGN PATENT DOCUMENTS

JP          9-153589          6/1997

* cited by examiner

*Primary Examiner*—David Nelms
*Assistant Examiner*—Mai-Huong Tran
(74) *Attorney, Agent, or Firm*—Mattingly, Stanger & Malur, P.C.

(57) ABSTRACT

A semiconductor device according to the invention is provided with square first semiconductor chip and second semiconductor chip laminated with each one main surface opposite, a supporting lead a part of which is arranged between one main surface of the first semiconductor chip and one main surface of the second semiconductor chip and a resin sealing body that seals the first semiconductor chip, the second semiconductor chip and the supporting lead and is characterized in that the respective one main surfaces of the first semiconductor chip and the second semiconductor chip are bonded to a part of the supporting lead via an adhesive layer and a part of the supporting lead is formed so that it has smaller width than the respective sides of the first semiconductor chip and the second semiconductor chip.

10 Claims, 25 Drawing Sheets

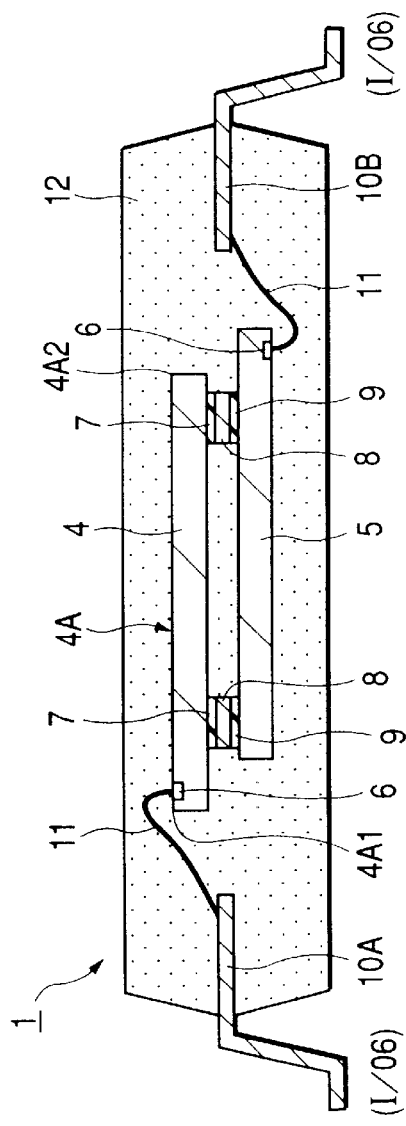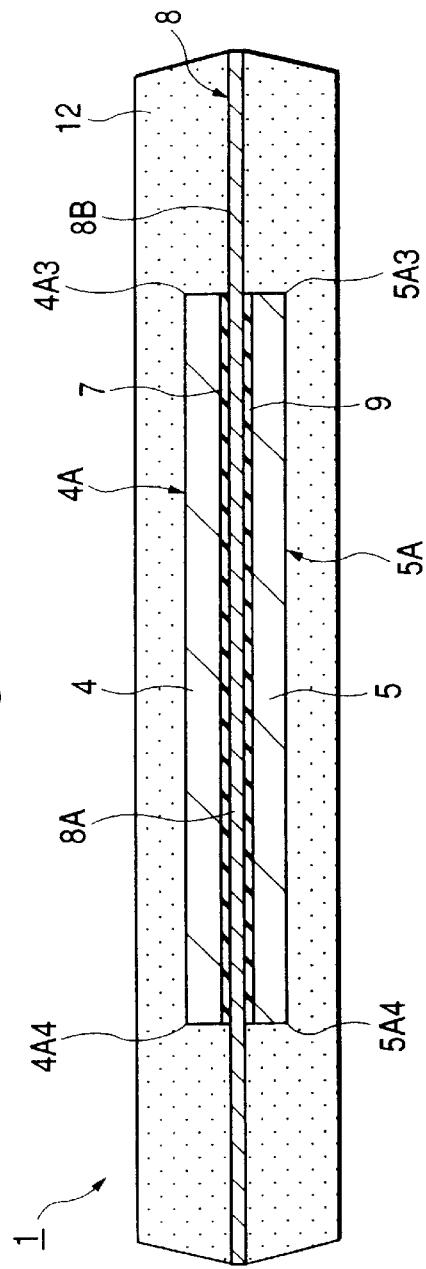

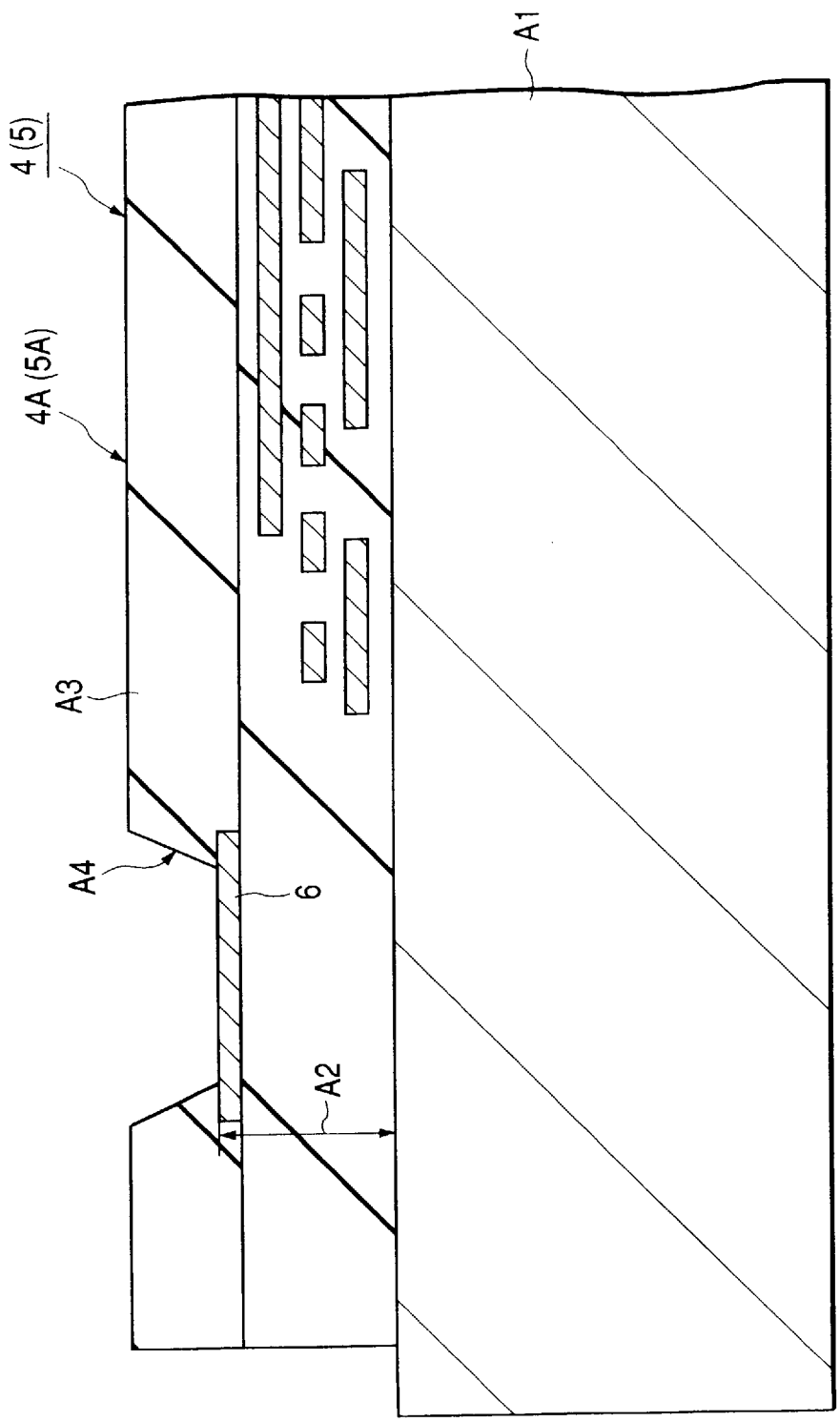

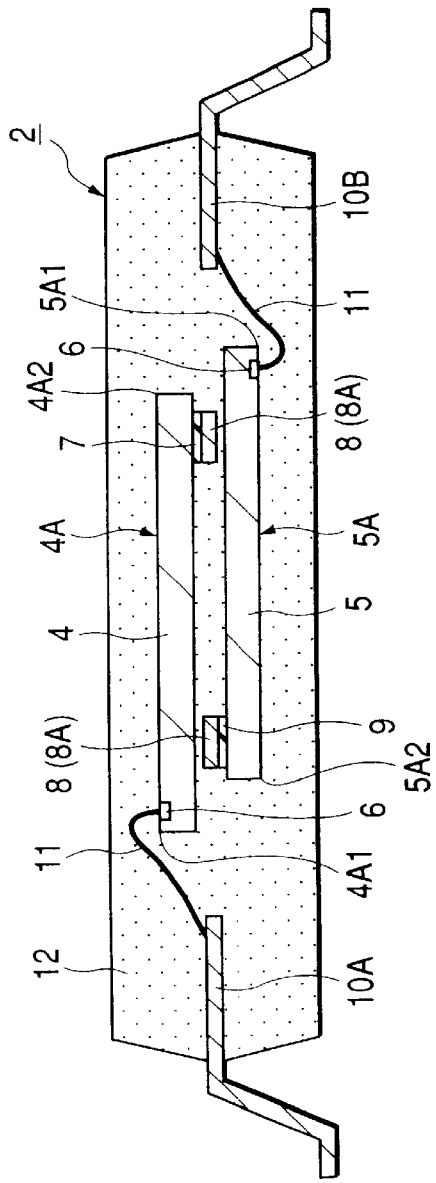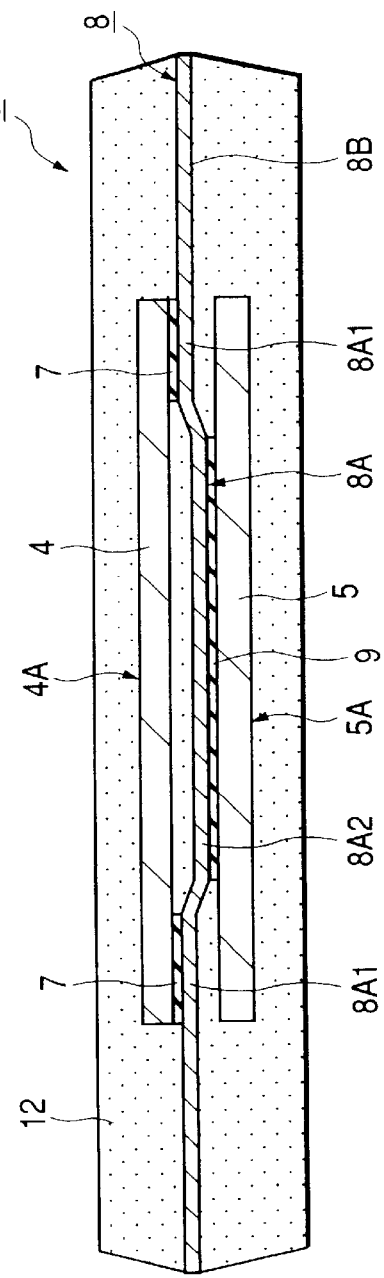

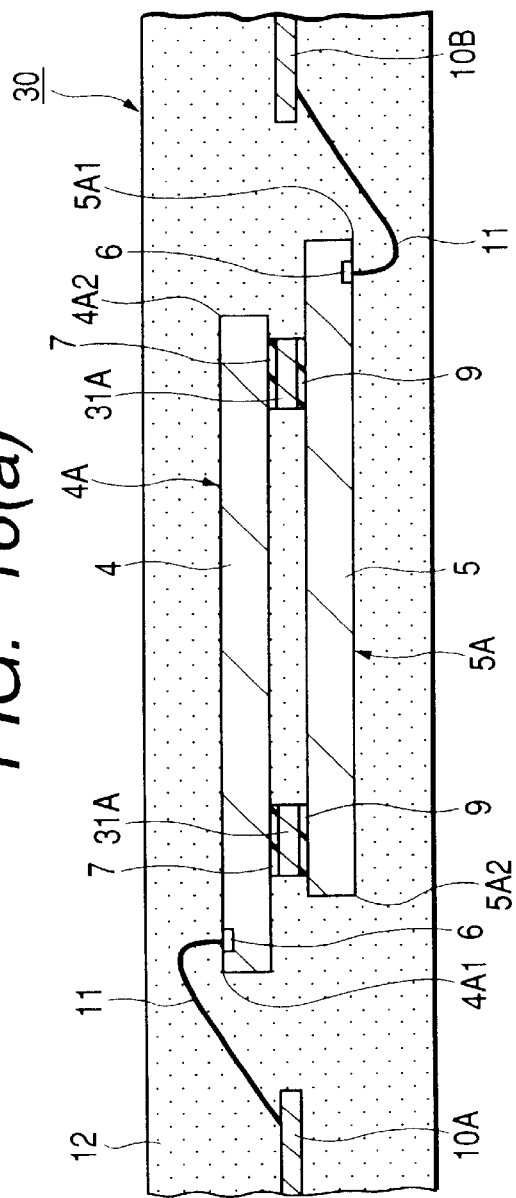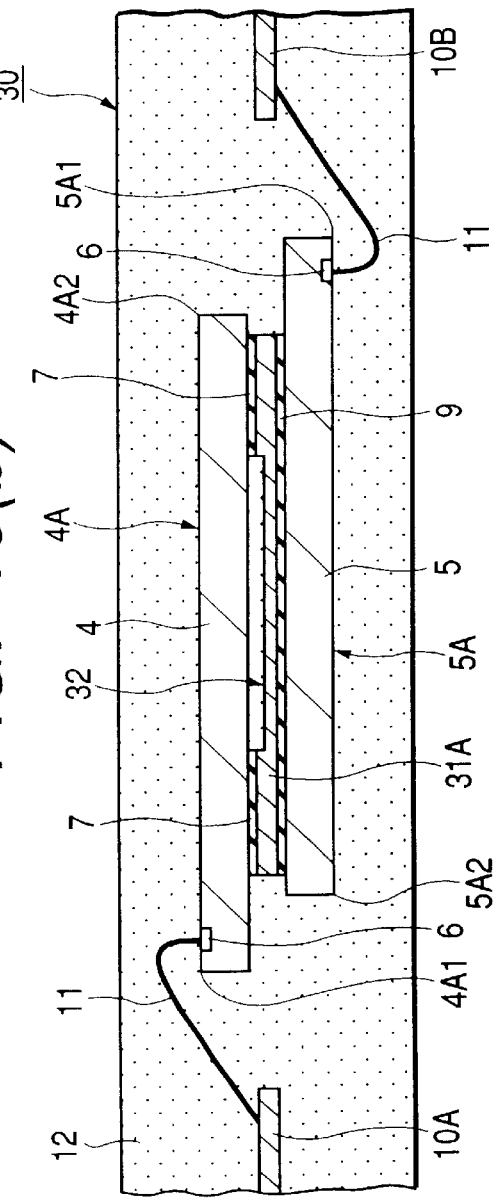

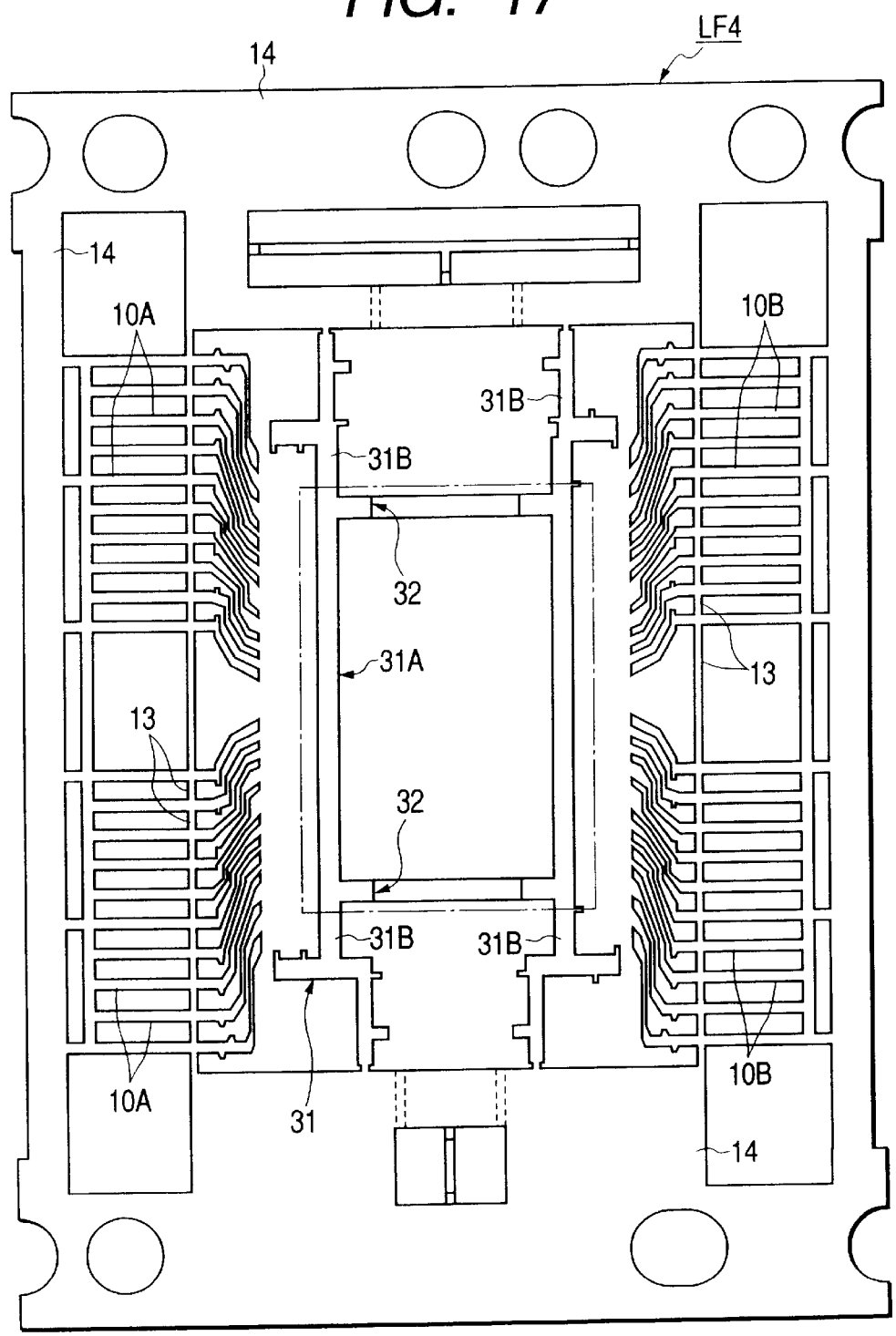

SEMICONDUCTOR DEVICE AND A METHOD OF MANUFACTURING THE SAME

BACKGROUND OF THE INVENTION

The present invention relates to a semiconductor device, particularly relates to technique effective to apply to a semiconductor device that seals laminated two semiconductor chips in one resin sealing body.

For the high density mounting of semiconductor chips, a stacked semiconductor device in which two semiconductor chips are laminated and are sealed in one resin sealing body is developed. For this type of stacked semiconductor device, various structures are proposed and produced as a product. For example, in Japanese published unexamined patent publication No. Hei 9(1997)-153589 (Laid-Open date: Jun. 10, 1997), a stacked semiconductor device in which a die pad (also called a tub) is not provided and two semiconductor chips are bonded with the respective rear surfaces (surfaces respectively opposite to a circuit forming surface) opposite is disclosed.

SUMMARY OF THE INVENTION

The inventors of the invention found the following problems as a result of discussing the stacked semiconductor device.

(1) A semiconductor chip is mainly provided with a semiconductor substrate, a multilayer wiring layer formed by laminating plural sets of an insulating layer and a wiring layer on the circuit forming surface of the semiconductor substrate and a surface passivation film (a final passivation film) formed so that the surface passivation film covers the multilayer wiring layer. For a semiconductor substrate, a silicon substrate for example is used, for an insulating layer, a silicon oxide film for example is used, for a wiring layer, a metallic film such as an aluminum film, an aluminum alloy film, a copper film and a copper alloy film is used and for a surface passivation film, polyimide resin high in an adhesive property to the resin of a resin sealing body for example is used. That is, as the circuit forming surface and the rear surface mutually opposite of the semiconductor chip are different in a coefficient of thermal expansion, the semiconductor chip is generally warped in a direction in which the rear surface is convex.

In the meantime, the rear surfaces of two semiconductor chips are generally bonded by applying an adhesive to the rear surface of one semiconductor chip and afterward, pressing the other semiconductor chip against the rear surface of one semiconductor chip with the rear surface of the other semiconductor chip opposite to the rear surface of one semiconductor chip. At this time, as shown in FIG. 29(a), as two semiconductor chips 101 are warped in a direction in which the respective rear surfaces are convex, the failure of wetting of an adhesive 102 often occurs in a periphery between the two semiconductor chips 101 and clearance 103 is formed in the periphery between the two semiconductor chips 101. As an interval of this clearance 103 is slight, resin 104 does not fully get into the clearance 103 and a void 105 is formed between the two semiconductor chips 101 as shown in FIG. 29(b) when a resin sealing body is formed according to a transfer molding method. Particularly, as multiple fillers (for example, silica) are generally mixed in the resin 104 to reduce stress, the resin 104 is prevented from getting into the clearance 103 narrower than the particle diameter of the filler by the filler and the void 105 is easily formed.

As a problem that thermal stress concentrates on the void 105 and the semiconductor chip 101 cracks with the void 105 in the center, in a curing process (a hardening process) after a resin sealing body is formed occurs in case such a void 105 is formed between the two semiconductor chips 101, the yield of the stacked semiconductor device is deteriorated.

FIGS. 29(a) and 29(b) are typical sectional views for explaining the problem of a conventional type, a reference number 106 denotes a die and 107 denotes a cavity.

(2) The thinning of a stacked semiconductor device is demanded. As the two semiconductor chips are laminated with the respective rear surfaces opposite in the case of the stacked semiconductor device, the thickness of the resin of a resin sealing body on the circuit forming surface of one semiconductor chip is required to be increased by quantity equivalent to the height of a loop of wire (the height from the circuit forming surface of the semiconductor chip to the vertex in a vertical direction) electrically connecting an electrode formed on the circuit forming surface of one semiconductor chip and a lead, and the thickness of the resin of a resin sealing body on the circuit forming surface of the other semiconductor chip is required to be increased by quantity equivalent to the height of a loop of wire electrically connecting an electrode formed on the circuit forming surface of the other semiconductor chip and a lead. That is, as the thickness of the resin of each resin sealing body on the respective circuit forming surfaces of the two semiconductor chips is required to be increased in case the two semiconductor chips are laminated with their respective rear surfaces opposite, it is difficult to thin the semiconductor device.

The object of the invention is to provide technique for enabling the enhancement of the yield of a semiconductor device in which plural semiconductor chips are laminated and are sealed in one resin sealing body.

Another object of the invention is to provide technique for enabling the thinning of a semiconductor device in which plural semiconductor chips are laminated and are sealed in one resin sealing body.

The object and another object of the invention and a new characteristic will be clarified by the description of the specification and the attached drawings.

The brief outline of the representative of the invention disclosed in this application is as follows.

(1) A semiconductor device according to the invention is based upon a semiconductor device provided with a first semiconductor chip and a second semiconductor chip respectively in a square laminated with their respective one main surfaces opposite to each other, a supporting lead a part of which is arranged between one main surface of the first semiconductor chip and one main surface of the second semiconductor chip and a resin sealing body that seals the first semiconductor chip, the second semiconductor chip and the supporting lead, and is characterized in that the respective one main surfaces of the first semiconductor chip and the second semiconductor chip are bonded to a part of the supporting lead via an adhesive layer and the part of the supporting lead is formed so that it is narrower than the respective sides of the first semiconductor chip and the second semiconductor chip.

(2) A semiconductor device according to the invention is based upon a semiconductor device provided with a first semiconductor chip which has opposite first main surface and second main surface, the plane of which is formed in a square and which is provided with plural electrodes arranged along a first side on the side of the first side of opposite first side and second side of the first main surface, a second semiconductor chip which has opposite first main surface and second main surface, the plane of which is formed in a square and which is provided with plural electrodes arranged along a first side on the side of the first side of opposite first side and second side of the first main surface, plural first leads each of which has an inner part and an outer part, the inner parts of which are arranged outside the first side of the first semiconductor chip and the inner parts of which are respectively electrically connected to the electrodes of the first semiconductor chip via each conductive wire, plural second leads each of which has an inner part and an outer part, the inner parts of which are arranged outside the first side of the second semiconductor chip and the inner parts of which are respectively electrically connected to the electrodes of the second semiconductor chip via each conductive wire and a resin sealing body that seals the first semiconductor chip, the second semiconductor chip, the respective inner parts of the plural first leads, the respective inner parts of the plural second leads and the conductive wires, and is characterized in that the first semiconductor chip and the second semiconductor chip are bonded with the respective first main surfaces opposite so that the first side of the first semiconductor chip and the second side of the second semiconductor chip are located on the side of the first lead, the electrode of the first semiconductor chip is located outside the second side of the second semiconductor chip and the electrode of the second semiconductor chip is located outside the second side of the first semiconductor chip.

According to the means (1) described above, as an interval between one main surface of the first semiconductor chip and one main surface of the second semiconductor chip is widened by a part of the supporting lead when the resin sealing body is formed, resin (sealing resin) can more easily get in between one main surface of the first semiconductor chip and one main surface of the second semiconductor chip. Therefore, a void caused due to the respective warps between the first semiconductor chip and the second semiconductor chip can be inhibited. As a result, as a problem that thermal stress concentrates on the void and the semiconductor chip cracks from the void in a curing process (in a hardening process) after the resin sealing body is formed can be inhibited, the yield of the semiconductor device can be enhanced.

According to the means (2) described above, as a part or the whole of the height of the loop of wire electrically connecting the electrode of the first semiconductor chip with the first lead is offset by the thickness of the first semiconductor chip and a part or the whole of the height of the loop of wire electrically connecting the electrode of the second semiconductor chip with the second lead is offset by the thickness of the second semiconductor chip, the thickness of the resin of the resin sealing body on the second main surface of the first semiconductor chip and the thickness of the resin of the resin sealing body on the second main surface of the second semiconductor chip can be thinned. As a result, as the whole thickness of the resin sealing body can be reduced, the semiconductor device can be thinned.

BRIEF DESCRIPTION OF THE DRAWINGS

FIG. 3 is a typical sectional view viewed along a line I—I in FIG. 1;

FIG. 4 is a typical sectional view viewed along a line I'—I' in FIG. 1;

FIG. 5 is a typical sectional view showing the configuration in outline of a semiconductor chip built in the semiconductor device equivalent to the first embodiment of the invention;

FIG. 13 is a typical sectional view showing a semiconductor device equivalent to a second embodiment of the invention;

FIG. 14 is a typical sectional view showing a semiconductor device equivalent to a third embodiment of the invention;

FIGS. 16(a) and 16(b) are typical sectional views showing the semiconductor device equivalent to the fourth embodiment of the invention;

FIG. 17 is a typical plan showing a lead frame used for manufacturing the semiconductor device equivalent to the fourth embodiment of the invention;

DESCRIPTION OF THE PREFERRED EMBODIMENTS

Figure 1:
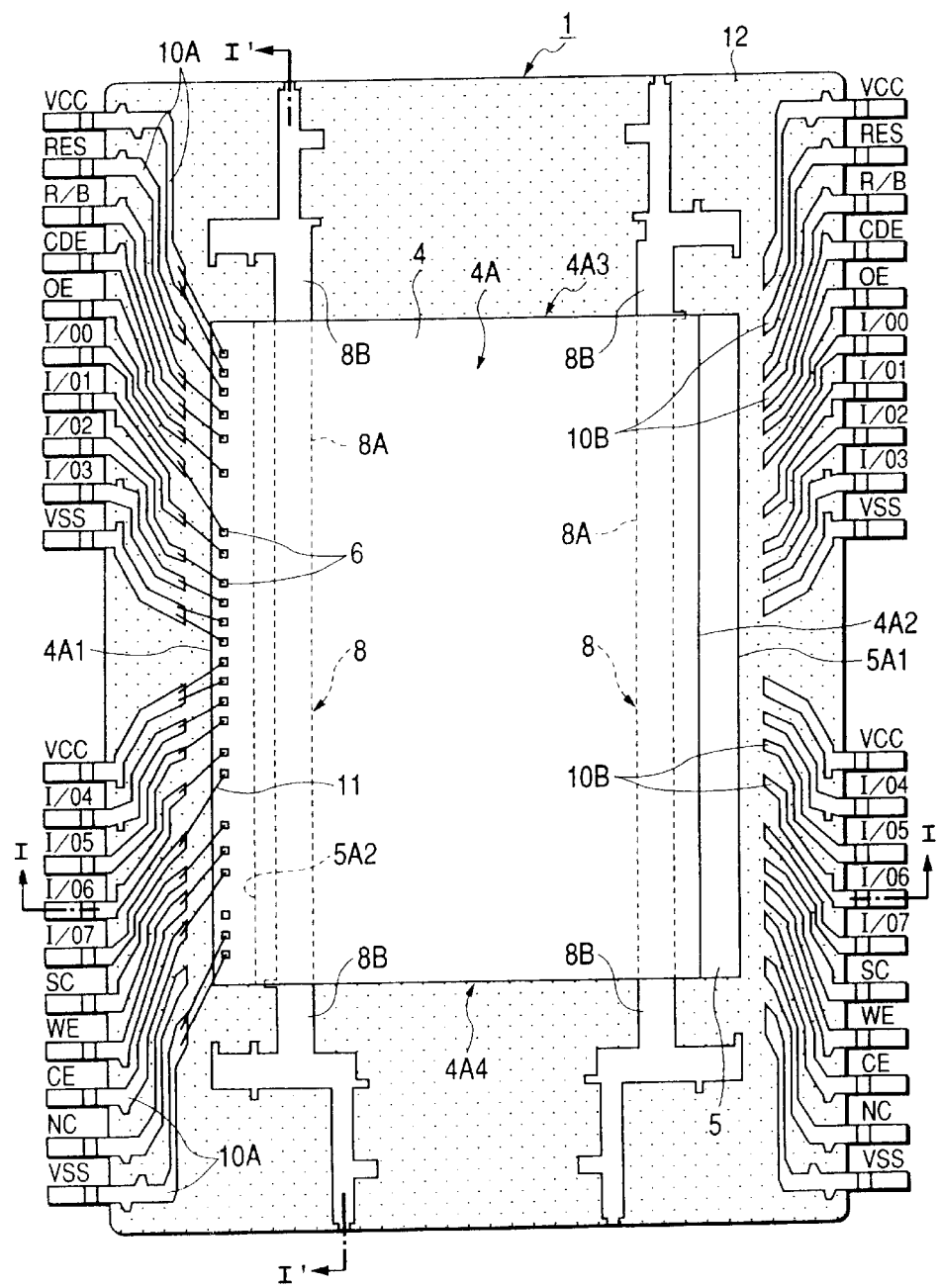
FIG. 1 is a typical plan showing a state that the upper part of a resin sealing body of a semiconductor device equivalent to a first embodiment of the invention is removed.

Referring to the drawings, embodiments of the invention will be described in detail below. In all the drawings for explaining the embodiments, the same reference number is allocated to a component having the same function and the repeated description is omitted.

First Embodiment

In a first embodiment, an example in which the invention is applied to a thin small out-line package (TSOP) type semiconductor device which is two-way lead array structure will be described.

Figure 2:
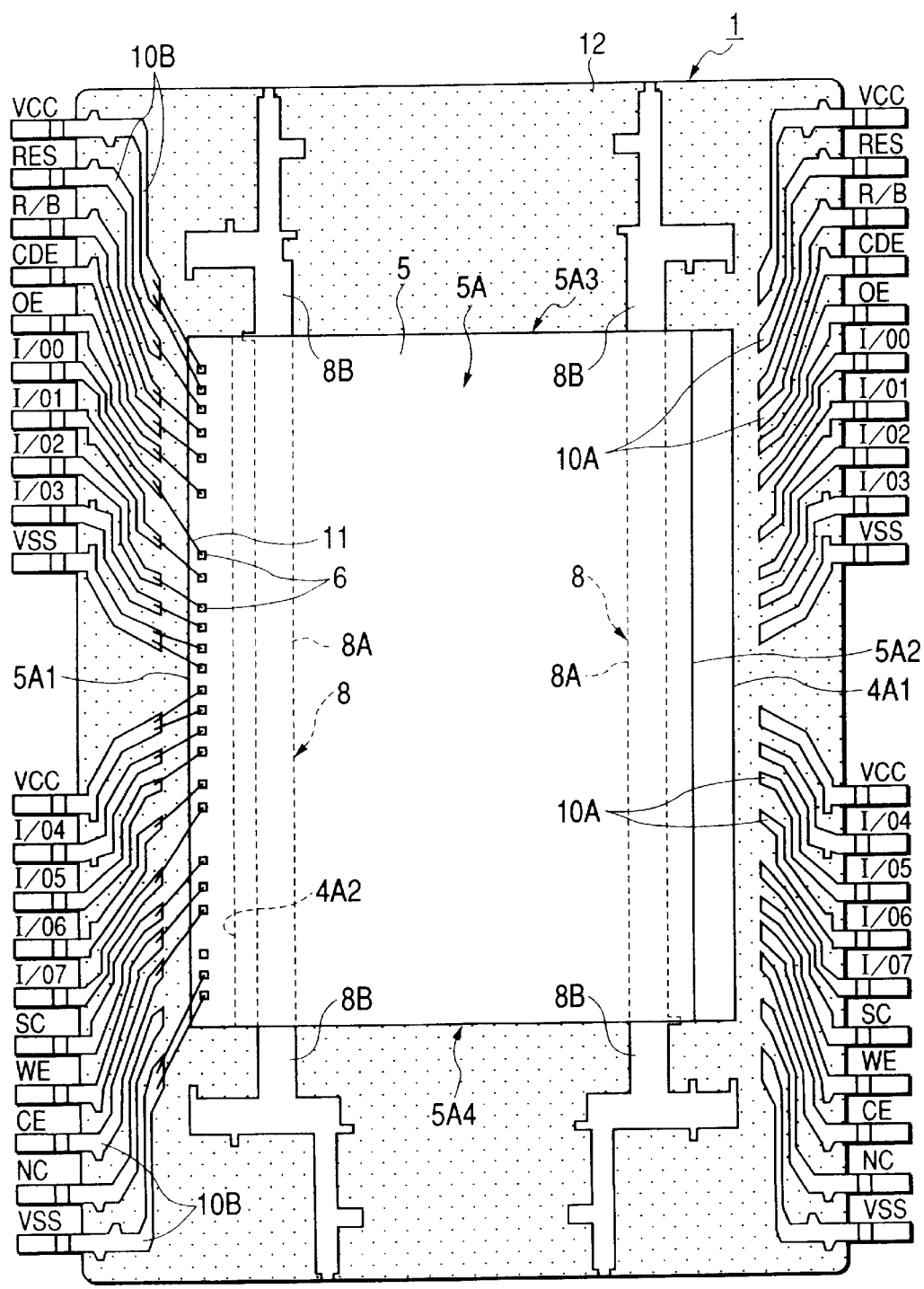
FIG. 2 is a typical bottom view showing a state that the lower part of the resin sealing body of the semiconductor device equivalent to the first embodiment of the invention is removed.

FIG. 1 is a plan showing a state that the upper part of a resin sealing body of a semiconductor device equivalent to the first embodiment of the invention is removed, FIG. 2 is a bottom view showing a state that the lower part of the resin sealing body of the semiconductor device is removed, FIG. 3 is a sectional view viewed along a line I—I shown in FIG. 1 and FIG. 4 is a sectional view viewed along a line B—B shown in FIG. 1. In FIGS. 1 and 2, a group of leads on the left side shown in FIG. 1 corresponds to a group of leads on the right side shown in FIG. 2 and a group of leads on the right side shown in FIG. 1 corresponds to a group of leads on the left side shown in FIG. 2.

As shown in FIGS. 1 to 3, the semiconductor device 1 equivalent to this embodiment includes two semiconductor chips 4 and 5 vertically laminated and seals the two semiconductor chips 4 and 5 in one resin sealing body. The semiconductor chips (hereinafter called only chips) 4 and 5 are laminated with the respective rear surfaces (surfaces opposite to a circuit forming surface) opposite.

The respective chips 4 and 5 are formed in the same outline size. Also, the respective planar form of the chips 4 and 5 is formed square and in this embodiment, they are formed in a rectangle of 8 mm×12 mm for example. A 64-Mbit electrically erasable programmable read only memory (EEPROM) called a flash memory for example is respectively built in these chips 4 and 5 as a storage circuit.

As shown in FIG. 5, the chips 4 and 5 are respectively mainly provided with a semiconductor substrate A1, a multilayer wiring layer A2 formed by laminating plural sets of an insulating layer and a wiring layer on the circuit forming surface of the semiconductor substrate A1 and a surface passivation film (a final passivation film) A3 formed so that the surface passivation film covers the multilayer wiring layer A2. For the semiconductor substrate A1, a silicon substrate for example is used, for the insulating layer, a silicon oxide film for example is used and for the wiring layer, a metallic film such as an aluminum (Al) film, an aluminum alloy film, a copper (Cu) film and a copper alloy film is used. For the surface passivation film, polyimide resin which can enhance the intensity of resistance to alpha rays in a memory for example and can enhance an adhesive property to the resin of a resin sealing body 12 is used. That is, as the opposite circuit forming surface and rear surface are different in a coefficient of thermal expansion, the two chips 4 and 5 are warped in a direction in which the respective rear surfaces are convex.

As shown in FIGS. 1 and 3, plural electrodes (bonding pads) 6 arranged along one longer side 4A1 are arranged on the side of one longer side 4A1 of two opposite longer sides of the circuit forming surface 4A of the chip 4. Each of the plural electrodes 6 is formed in the uppermost wiring layer of the multilayer wiring layer A2 of the chip 4 as shown in FIG. 5. The uppermost wiring layer is covered with the surface passivation film A3 formed on the uppermost wiring layer and an opening A4 for a bonding pad which exposes the surface of the electrode 6 is formed in the surface passivation film A3.

As shown in FIGS. 2 and 3, plural electrodes (bonding pads) 6 arranged along one longer side 5A1 are arranged on the side of one longer side 5A1 of the opposite two longer sides of the circuit forming surface 5A of the chip 5. Each of the plural electrodes 6 is formed in the uppermost wiring layer of the multilayer wiring layer A2 of the chip 5 as shown in FIG. 5. The uppermost wiring layer is covered with the surface passivation film A3 formed on the uppermost wiring layer and an opening A4 for a bonding pad which exposes the surface of the electrode 6 is formed in the surface passivation film A3.

The circuit pattern of a flash memory built in the chip 4 is the same as that of a flash memory built in the chip 5. Also, the layout pattern of the electrodes 6 formed on the circuit forming surface 4A of the chip 4 is the same as that of the electrodes 6 formed on the circuit forming surface 5A of the chip 5. That is, the chips 4 and 5 have the same structure.

As shown in FIGS. 1 to 3, the planar form of the resin sealing body 12 is formed in a square and in this embodiment, it is formed in a rectangle of 300 mil for example. Plural leads 10A arranged along one longer side are arranged on the side of one longer side of the opposite two longer sides of the resin sealing body 12 and plural leads 10B arranged along the other longer side are arranged on the side of the other longer side.

The plural leads 10A and the plural leads 10B are respectively extended inside and outside the resin sealing body 12 and each lead has an inner part (an inner lead portion) located inside the resin sealing body 12 and an outer part (an outer lead portion) located outside the resin sealing body 12. The respective outer parts of the plural leads 10A and 10B are formed in a state that they are bent in gull-wing type lead form which is one of surface mounting type lead forms for example.

The respective inner parts of the plural leads 10A are arranged outside one longer side 4A1 of the chip 4 and each inner part is electrically connected to the electrode 6 of the chip 4 via conductive wire 11 as shown in FIGS. 1 and 3. The respective inner parts of the plural leads 10B are arranged outside one longer side 5A1 of the chip 5 and each inner part is electrically connected to the electrode 6 of the chip 5 via conductive wire 11 as shown in FIGS. 2 and 3. For the conductive wire 11, gold (Au) wire for example is used.

For a method of connecting the wire 11, ball bonding using ultrasonic vibration for thermo-compression bonding for example is used.

A terminal name is given to each of the plural leads 10A and 10B. VCC terminal is an operating potential terminal the potential of which is fixed to operating potential (for example, 5 V) of the potential of power supply. VSS terminal is a reference potential terminal the potential of which is fixed to reference potential (for example, 0 V) of the potential of power supply. I/O0 terminal to I/O7 terminal are data input-output terminals. RES terminal is a reset terminal. R/B terminal is a ready/busy terminal. CDE terminal is a command data enable terminal. OE terminal is an output enable terminal. SC terminal is a serial clock terminal. WE terminal is a write enable terminal. CE terminal is a chip enable terminal. NC terminal is an idle terminal.

The respective rear surfaces of the two chips 4 and 5 are opposed so that one longer side 4A1 of the chip 4 and the other longer side 5A2 of the chip 5 are located on the side of the lead 10A, and the two chips are laminated in a state that the respective positions are off (in a state that one longer side 4A1 of the chip 4 and one longer side 5A1 of the chip 5 are off in a direction in which they mutually go away) so that the electrode 6 of the chip 4 is located outside the other longer side 5A2 of the chip 5 and the electrode 6 of the chip 5 is located outside the other longer side 4A2 of the chip 4.

The semiconductor device 1 equivalent to this embodiment is provided with two supporting leads 8 as shown in FIGS. 1 to 4. The two supporting leads 8 are respectively extended from one shorter side toward the other shorter side of opposite two shorter sides of the resin sealing body 12 and cross opposite two shorter sides 4A3 and 4A4 of the circuit forming surface 4A of the chip 4 and opposite two shorter sides 5A3 and 5A4 of the circuit forming surface 5A of the chip 5. The two supporting leads 8 respectively have a first part 8A located between the chip 4 and the chip 5 and a second part 8B integrated with the first part 8A and located outside the chips 4 and 5.

The two supporting leads 8 are arranged with them mutually apart. The first part 8A of one supporting lead 8 is arranged on the side of one longer side 4A1 of the chip 4 (on the side of the other longer side 5A2 of the chip 5) and the first part 8A of the other supporting lead 8 is arranged on the side of the other longer side 4A2 of the chip 4 (on the side of one longer side 5A1 of the chip 5).

The rear surface of the chip 4 is bonded to the respective first parts 8A of the two supporting leads 8 via an adhesive layer 7. The rear surface of the chip 5 is bonded to the respective first parts 8A of the two supporting leads 8 via an adhesive layer 9. The respective first parts 8A of the two supporting leads 8 are formed so that they respectively have smaller width than a value acquired by dividing the length of the shortest side of the four sides of each chip 4, 5 by the number of the supporting leads 8. In this embodiment, the respective first parts 8A of the two supporting leads 8 are respectively formed so that each first part has the width of approximately 0.5 mm for example.

The resin sealing body 12 is formed by biphenyl thermosetting resin to which a phenol setting agent, silicone rubber, a filler for example are added to reduce stress. This resin sealing body 12 is formed by a transfer molding method suitable for mass production. The transfer molding method is a method of forming a resin sealing body by pressure injecting resin into a cavity from a pot via a runner and an inflow gate using a mold provided with the pot, the runner, the inflow gate and the cavity.

Figure 6:
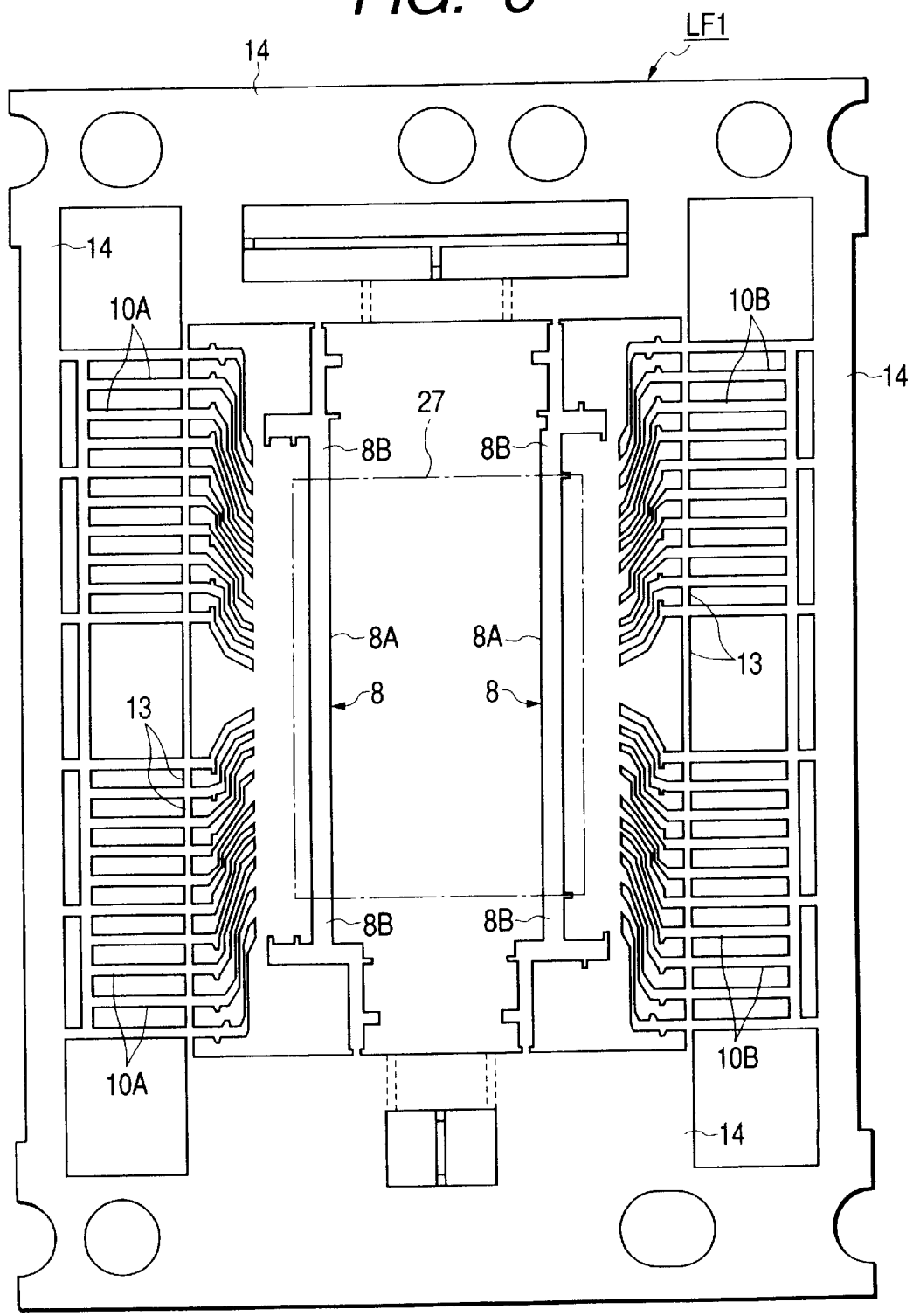
FIG. 6 is a typical plan showing a lead frame used for manufacturing the semiconductor device equivalent to the first embodiment of the invention.

Next, referring to FIG. 6, a lead frame used for manufacturing the semiconductor device will be described. FIG. 6 is a typical plan showing a lead frame. Though an actual lead frame has multiple string structure so that plural semiconductor devices can be manufactured, an area for one in which one semiconductor device is manufactured is shown in FIG. 6 so that the drawing is plain.

As shown in FIG. 6, plural leads 10A, plural leads 10B, two supporting leads 8 are arranged in an area defined by a frame 14 of a lead frame LF1. The plural leads 10A are arranged along one longer side of two opposite longer sides of the frame 14 and are integrated with one longer side. The plural leads 10B are arranged along the other longer side of two opposite longer sides of the frame 14 and are integrated with the other longer side. The two supporting leads 8 are arranged between a group of the plural leads 10A and a group of the plural leads 10B and are integrated with the frame 14. That is, the lead frame LF1 has two-way lead array structure.

Each of the plural leads 10A has an inner part sealed in a resin sealing body and an outer part lead outside the resin sealing body and are coupled via a tie-bar 13. Each of the plural leads 10B has an inner part sealed in the resin sealing body and an outer part lead outside the resin sealing body and are coupled via a tie-bar 13.

Each of the two supporting leads 8 has a first part 8A arranged between chips 4 and 5 (in a superimposed area 27) and a second part 8B integrated with the first part 8A and arranged outside the chips 4 and 5.

The lead frame LF1 is formed by applying etching working or press working to a flat plate made of an alloy of iron (Fe) and nickel (Ni), copper (Cu) or an alloy of copper for example and forming a predetermined pattern. The lead frame LF1 in this embodiment is formed so that it has the thickness of approximately 0.15 mm.

Next, referring to FIGS. 7 to 10 (typical sectional views), the manufacture of the semiconductor device 1 will be described.

Figure 7A:
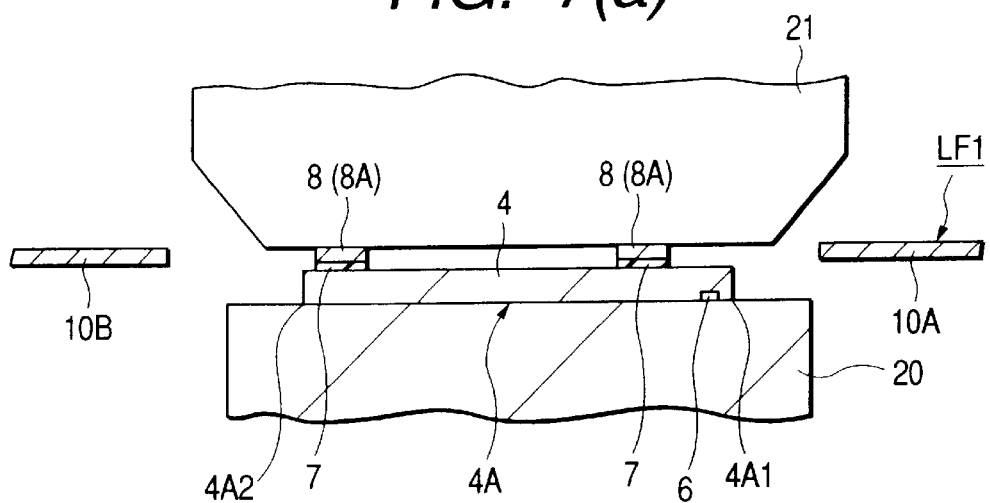
FIGS. 7(a) to 7(c) are typical sectional views for explaining the manufacture of the semiconductor device equivalent to the first embodiment of the invention.

First, one chip 4 is bonded and fixed to the lead frame LF1. The lead frame LF1 and the chip 4 are fixed by mounting the chip 4 on a heat stage 20 in a state that the heat stage 20 and the circuit forming surface 4A of the chip 4 are opposite as shown in FIG. 7(a), afterward applying a paste adhesive in which for example, silver (Ag) powder is mixed in epoxy thermosetting resin is applied to the rear surface of the chip 4 by a multipoint application method so as to form an adhesive layer 7 and afterward thermo-compression bonding the first part 8A of the supporting lead 8 to the circuit forming surface 4A of the chip 4 by a bonding tool 21. At this time, the chip 4 is mounted so that one longer side 4A1 of the chip 4 is located on the side of the lead 10A (one group of leads of two opposite lead groups).

The adhesive layer 7 may be also formed using an insulating resin film in which an adhesive layer is provided on both surfaces (the surface and the rear surface), however, in this case, as the adhesive layer 7 is thicker, compared with a case that the adhesive layer 7 is formed by applying an adhesive, the resin sealing body is slightly thicker.

Figure 7B:
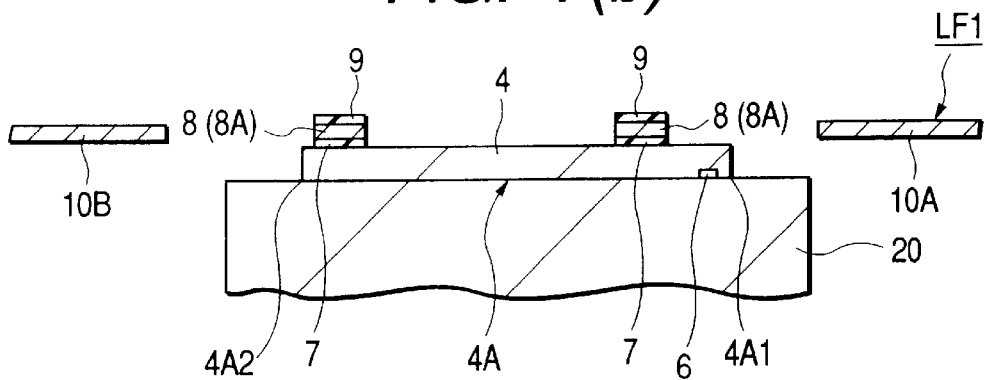
Figure 7C:
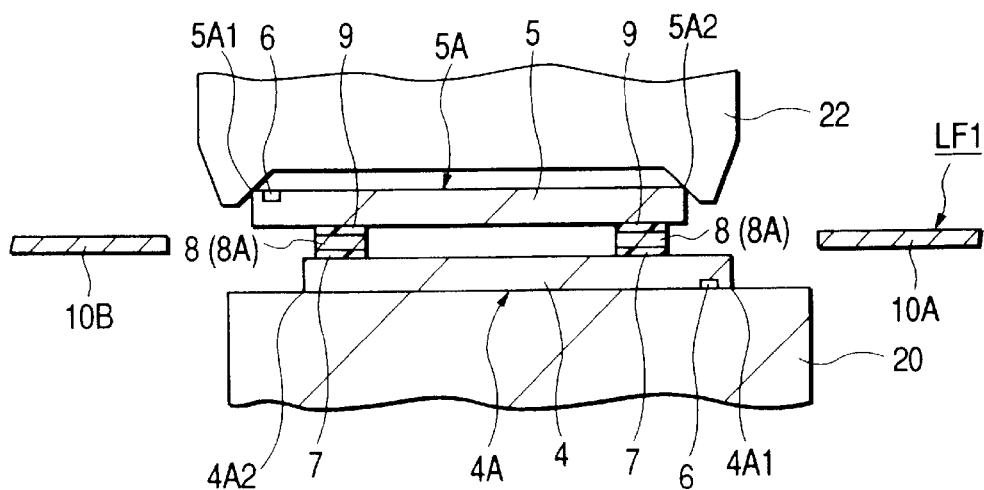

Next, the other chip 5 is bonded and fixed to the lead frame LF1. The lead frame LF1 and the chip 5 are fixed by applying a paste adhesive in which for example, silver (Ag) powder is mixed in epoxy thermosetting resin is applied to the first part 8A of the supporting lead 8 by the multipoint application method so as to form an adhesive layer 9 as shown in FIG. 7(b) and afterward thermo-compression bonding the chip 5 to the first part 8A of the supporting lead 8 with the rear surface of the chip 4 and the rear surface of the chip 5 opposite by a bonding tool 22 as shown in FIG. 7(c). At this time, the chip 5 is mounted so that one longer side 5A1 of the chip 5 is located on the side of the lead 10B (the other group of leads of two opposite lead groups). Mounting is performed in a state that the following respective positions are off (one longer side 4A1 of the chip 4 and one longer side 5A1 of the chip 5 are off in a direction in which the respective sides mutually go away) so that one longer side 4A1 of the chip 4 is located outside the other longer side 5A2 of the chip 5 and one longer side 5A1 of the chip 5 is located outside the other longer side 4A2 of the chip 4. It is desirable that quantity by which the respective positions of the chip 4 and the chip 5 are off is an extent that the electrode 6 of the chip 4 is located outside the other longer side 5A2 of the chip 5 and the electrode 6 of the chip 5 is located outside the other longer side 4A2 of the chip 4.

The adhesive layer 9 may be also formed using an insulating resin film on both surfaces of which an adhesive layer is provided, however, in this case, as the adhesive layer 9 is thicker, compared with a case that the adhesive layer 9 is formed by applying an adhesive, the resin sealing body is slightly thicker.

Figure 8D:
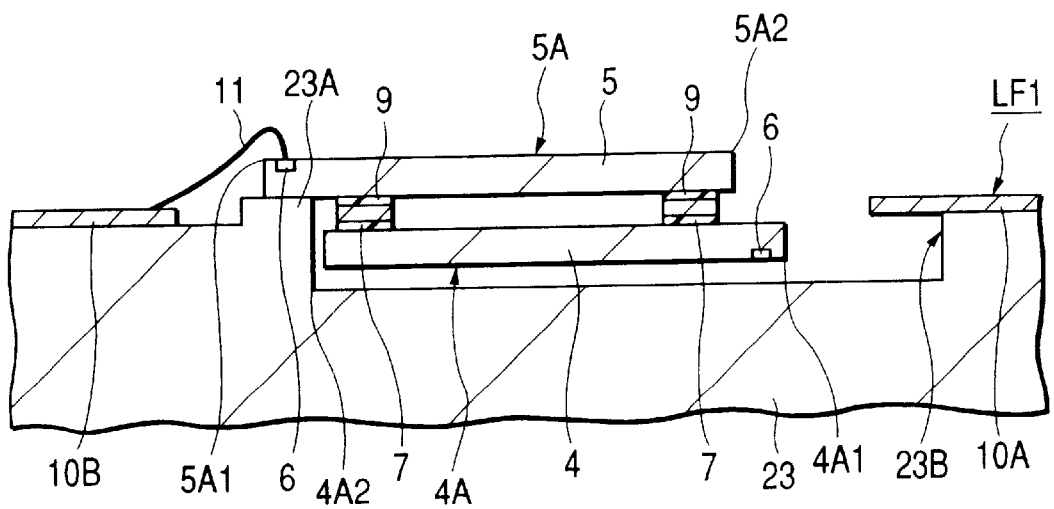
FIGS. 8(d) and 8(e) are typical sectional views for explaining the manufacture of the semiconductor device equivalent to the first embodiment of the invention.

Next, the electrode 6 of the chip 5 and the lead 10B are electrically connected via conductive wire 11. The electrode 6 of the chip 5 and the lead 10B are connected by mounting the lead frame LF1 on a heat stage 23 with the heat stage 23 and the circuit forming surface 4A of the chip 4 opposite as shown in FIG. 8(d). For the wire 11, for example, Au wire is used. Also, for a method of connecting the wire 11, for example, ball bonding using ultrasonic vibration for thermo-compression bonding is used.

In this process, as one longer side SA1 of the chip 5 is located outside the other longer side 4A2 of the chip 4, the rear surface of the chip 4 can be directly touched to the heat stage 23 by providing a projection 23A to the heat stage 23 so that the projection is touched to the rear surface of the chip 5.

That is, as the rear surface of the chip 5 can be directly touched to the heat stage 23 and the heat of the heat stage 23 is effectively transmitted to the electrode 6 of the chip 5 by opposing the respective rear surfaces of the chips 4 and 5 so that one longer side 4A1 of the chip 4 and the other longer side 5A2 of the chip 5 are located on the side of the lead 10A and laminating the chips 4 and 5 in a state that the respective positions are off so that one longer side 4A1 of the chip 4 is located outside the other longer side 5A2 of the chip 5 and one longer side 5A1 of the chip 5 is located outside the other longer side 4A2 of the chip 4, a failure of connection between the electrode 6 of the chip 5 and the wire 11 can be reduced.

In this process, as the chip 4 is arranged on the heat stage 23 in a state that the circuit forming surface 4A is directed downward, a depression 23B is provided to the heat stage 23 to prevent the electrode 6 of the chip 4 and the heat stage 23 from being touched.

Figure 8E:
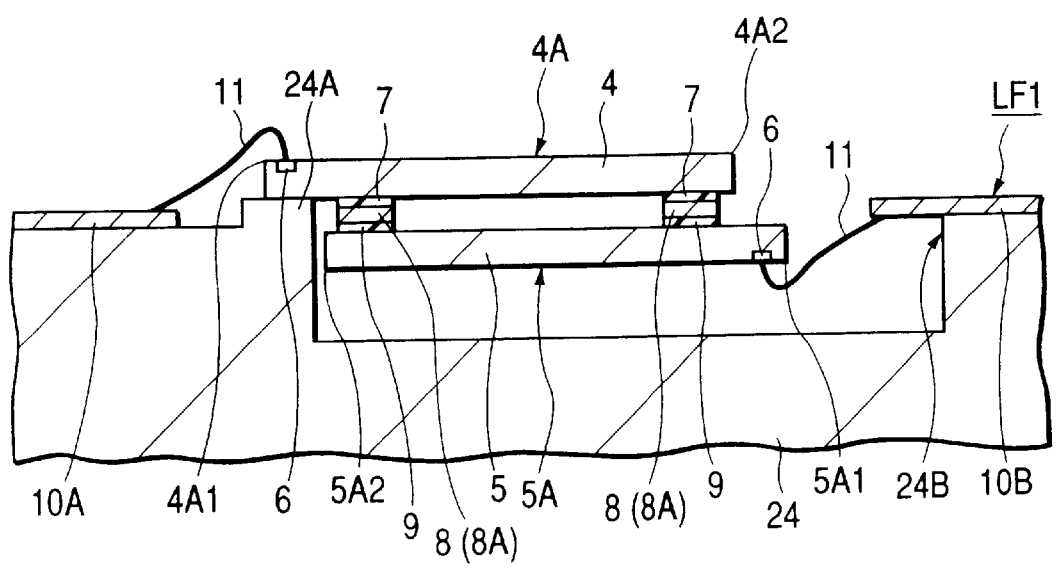

Next, after the lead frame LF1 is reversed so that the circuit forming surface 4A of the chip 4 is directed upward, the electrode 6 of the chip 4 and the lead 10A are electrically connected via the conductive wire 11. The electrode 6 of the chip 4 and the lead 10A are connected by mounting the lead frame LF1 on a heat stage 24 in a state that the heat stage 24 and the circuit forming surface 5A of the chip 5 are opposite as shown in FIG. 8(e). For the wire 11, for example, Au wire is used. For a method of connecting the wire 11, for example, ball bonding in which ultrasonic vibration is used for thermo-compression bonding is used.

In this process, as one longer side 4A1 of the chip 4 is located outside the other longer side 5A2 of the chip 5, the rear surface of the chip 4 can be in directly contact with the heat stage 24 by providing a projection 24A to the heat stage 24 so that the projection comes into contact with the rear surface of the chip 4.

That is, as the rear surface of the chip 4 can be directly touched to the heat stage 24 by opposing the respective rear surfaces of the chips 4 and 5 so that one longer side 4A1 of the chip 4 and the other longer side 5A2 of the chip 5 are located on the side of the lead 10A and laminating the chips 4 and 5 in a state that the respective positions are off so that one longer side 4A1 of the chip 4 is located outside the other longer side 5A2 of the chip 5 and one longer side 5A1 of the chip 5 is located outside the other longer side 4A2 of the chip 4 and the heat of the heat stage 24 is effectively transmitted to the electrode 6 of the chip 4, a failure of connection between the electrode 6 of the chip 4 and the wire 11 can be reduced.

In the above process, as the first wire bonding process for electrically connecting the electrode 6 of the chip 4 and the lead 10A via the wire 11 and the second wire bonding process for electrically connecting the electrode 6 of the chip 5 and the lead 10B via the wire 11 are executed after the first chip bonding process for bonding and fixing the first part 8A of the supporting lead 8 and the rear surface of the chip 4 and the second chip bonding process for bonding and fixing the first part 8A of the supporting lead 8 and the rear surface of the chip 5, the deformation of the wire caused in the chip bonding process can be substantially eliminated.

In this process, as the chip 5 is arranged on the heat stage 24 in a state that the circuit forming surface 5A is directed downward, a depression 24B is provided to the heat stage 24 to prevent the heat stage 24 and the wire 11 from being touched.

Figure 9:
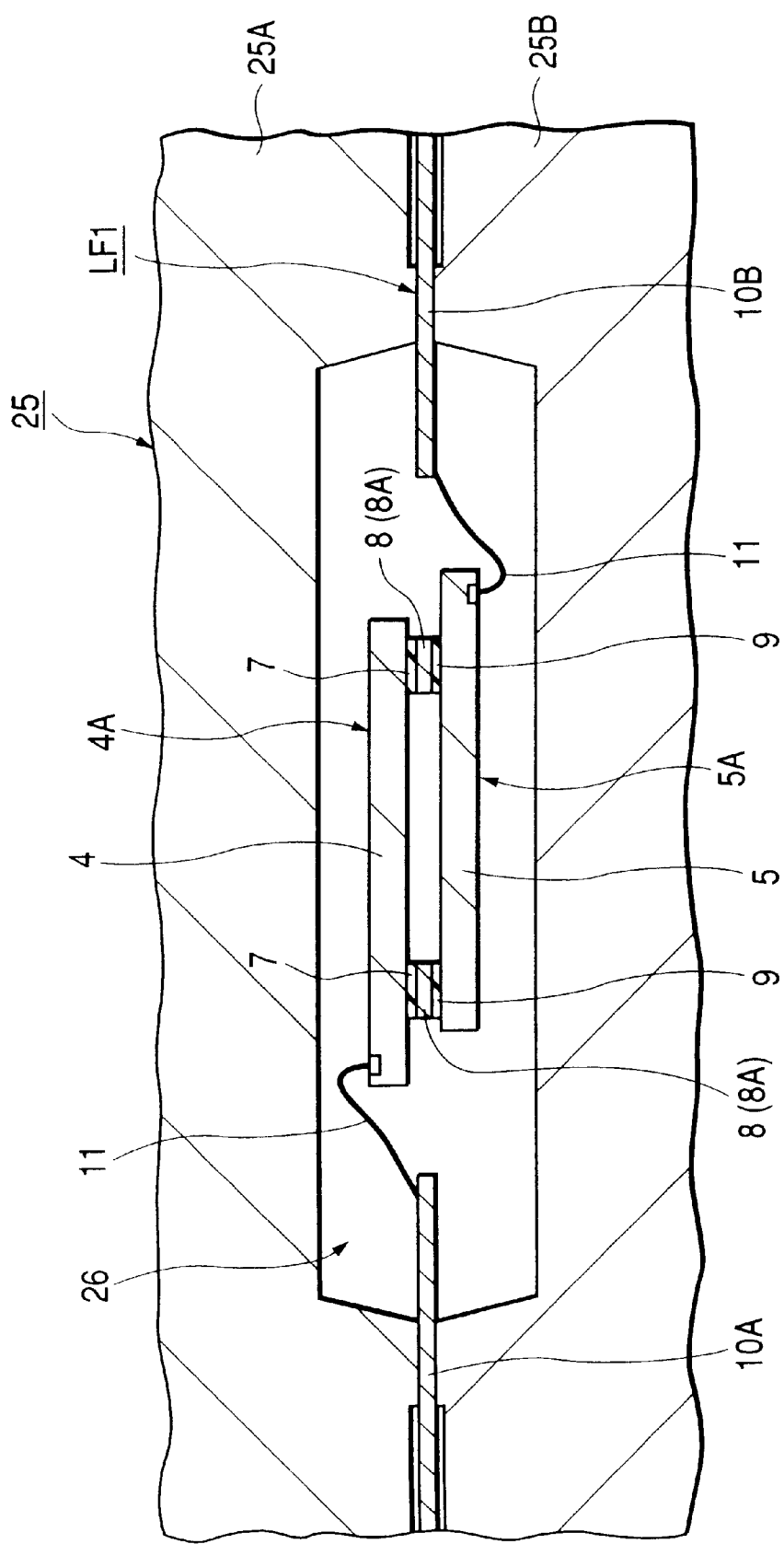
FIG. 9 is a typical sectional view for explaining the manufacture of the semiconductor device equivalent to the first embodiment of the invention.

Next, as shown in FIG. 9, the lead frame LF1 is positioned between an upper mold 25A and a lower mold 25B of a metallic mold 25 of a transfer molding machine. At this time, inside a cavity 26 formed by the upper mold 25A and the lower mold 25B, the chips 4 and 5, each inner part of the leads 10A, each inner part of the leads 10B, the supporting leads 8, the wires 11 and the like are arranged.

Figure 10:
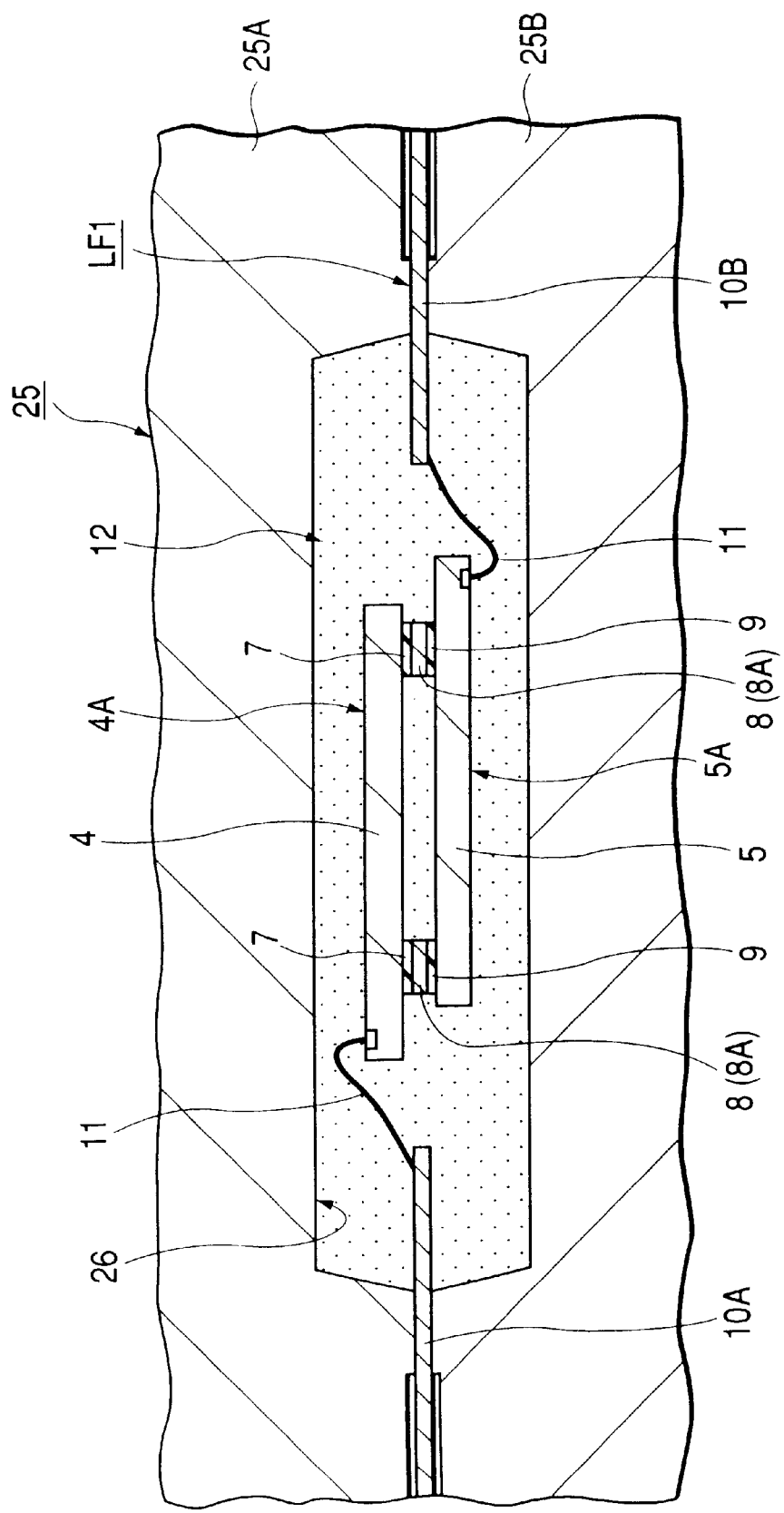
FIG. 10 is a typical sectional view for explaining the manufacture of the semiconductor device equivalent to the first embodiment of the invention.

Next, fluid resin (melted resin) is pressurized and injected into the cavity 26 from the sprue of the metallic mold 25 via a runner, an inflow gate and the like to form a resin sealing body 12. The chips 4 and 5, each inner part of the leads 10A, each inner part of the leads 10B, the supporting leads 8, the wires 11 and the like are sealed by the resin sealing body 12 as shown in FIG. 10. For the resin, for example, a phenol setting agent, silicone rubber and biphenyl thermosetting resin to which a filler and the like are added are used.

In this process, as an interval between the rear surface of the chip 4 and the rear surface of the chip 5 is widened by the first part 8A of the supporting lead 8, resin (sealing resin) more easily gets in between the rear surface of the chip 4 and the rear surface of the chip 5. Therefore, a void caused due to the respective warps between the chips 4 and 5 can be inhibited.

Next, the semiconductor device 1 shown in FIGS. 1 to 4 is substantially completed by taking the lead frame LF1 out of the metallic mold 25, afterward executing a curing process for hardening the resin sealing body 12, afterward cutting a tie-bar 13 connected to each lead 10A and a tie-bar 13 connected to each lead 10B, afterward cutting the respective outer parts of each lead 10A, 10B from the frame 14 of the lead frame LF1, afterward forming the respective outer parts of each lead 10A, 10B in the shape of a gull's wing for example which is one of surface mounting type and afterward cutting the supporting lead 8 from the frame 14 of the lead frame LF1.

As described above, according to this embodiment, the following effect is acquired.

In the semiconductor device 1, the respective rear surfaces (one main surfaces) of the chips 4 and 5 are bonded to the respective first parts 8A of the two supporting leads 8 via the adhesive layers 7 and 9 and the respective first parts 8A of the two supporting leads 8 are formed so that they respectively have smaller width than a value acquired by dividing the length of the shortest side of the respective sides of the chips 4 and 5 by the number of the supporting leads 8.

As an interval between the rear surface of the chip 4 and the rear surface of the chip 5 is widened by the first part 8A of the supporting lead 8 by such configuration when the resin sealing body 12 is formed, resin (sealing resin) more easily gets in between the rear surface of the chip 4 and the rear surface of the chip 5. Therefore, a void caused due to the respective warps between the chips 4 and 5 can be inhibited. As a result, in a curing process (a hardening process) after the resin sealing body 12 is formed, as a problem that thermal stress concentrates on the void and the chips 4 and 5 are cracked from the void can be inhibited, the yield of the semiconductor device can be enhanced.

Figure 11:
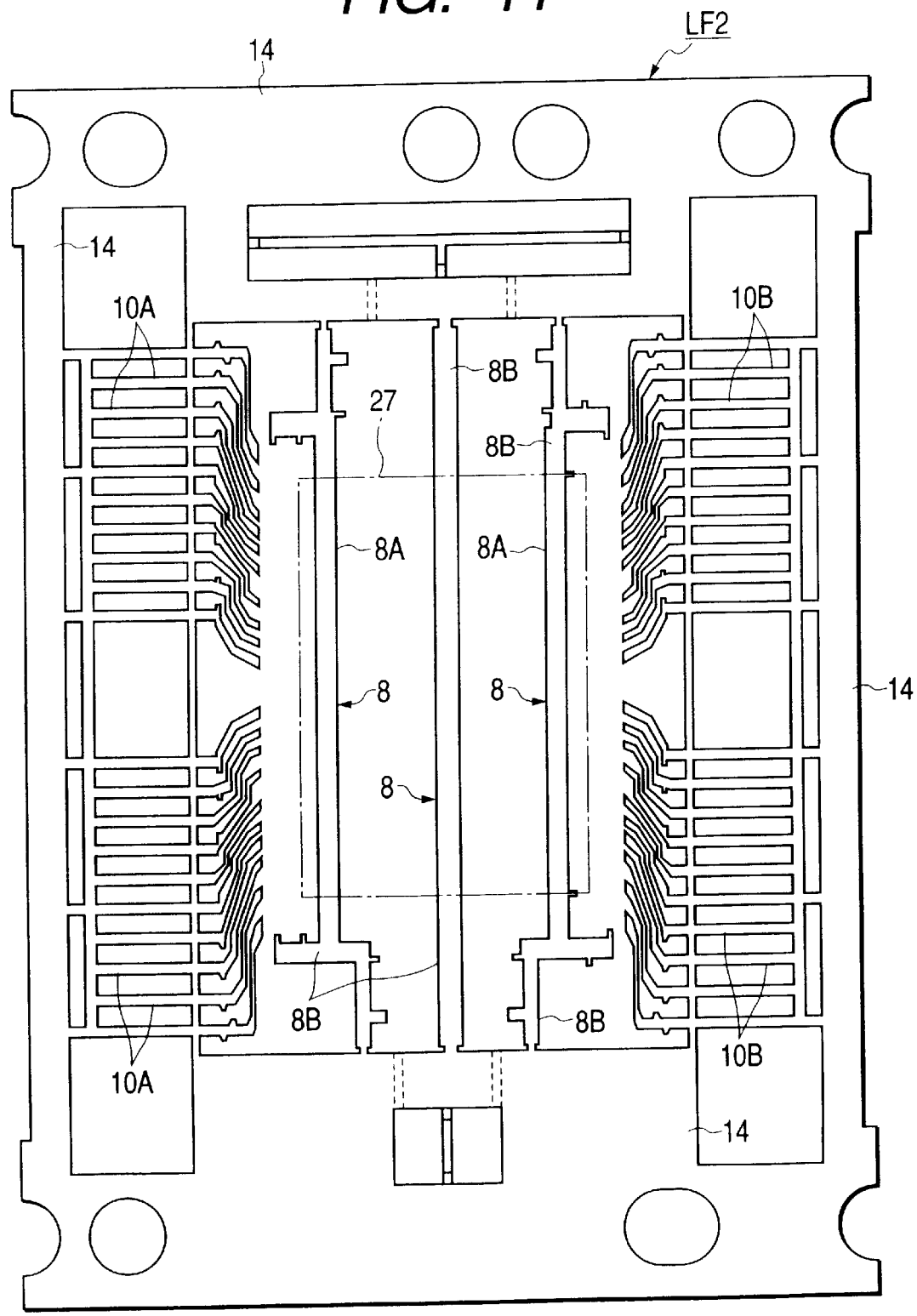
FIG. 11 is a typical plan showing a lead frame in a first transformed example of the first embodiment of the invention.

In this embodiment, the example using the lead frame provided with the two supporting leads 8 is described, however, as shown in FIG. 11 (a typical sectional view), a lead frame LF2 provided with three supporting leads 8 maybe also used. However, the respective first parts 8A of the three supporting leads 8 are required to be formed so that they respectively have smaller width than a value acquired by dividing the length of the shortest side of the respective sides of the chips 4 and 5 by the number of the supporting leads.

Figure 12:
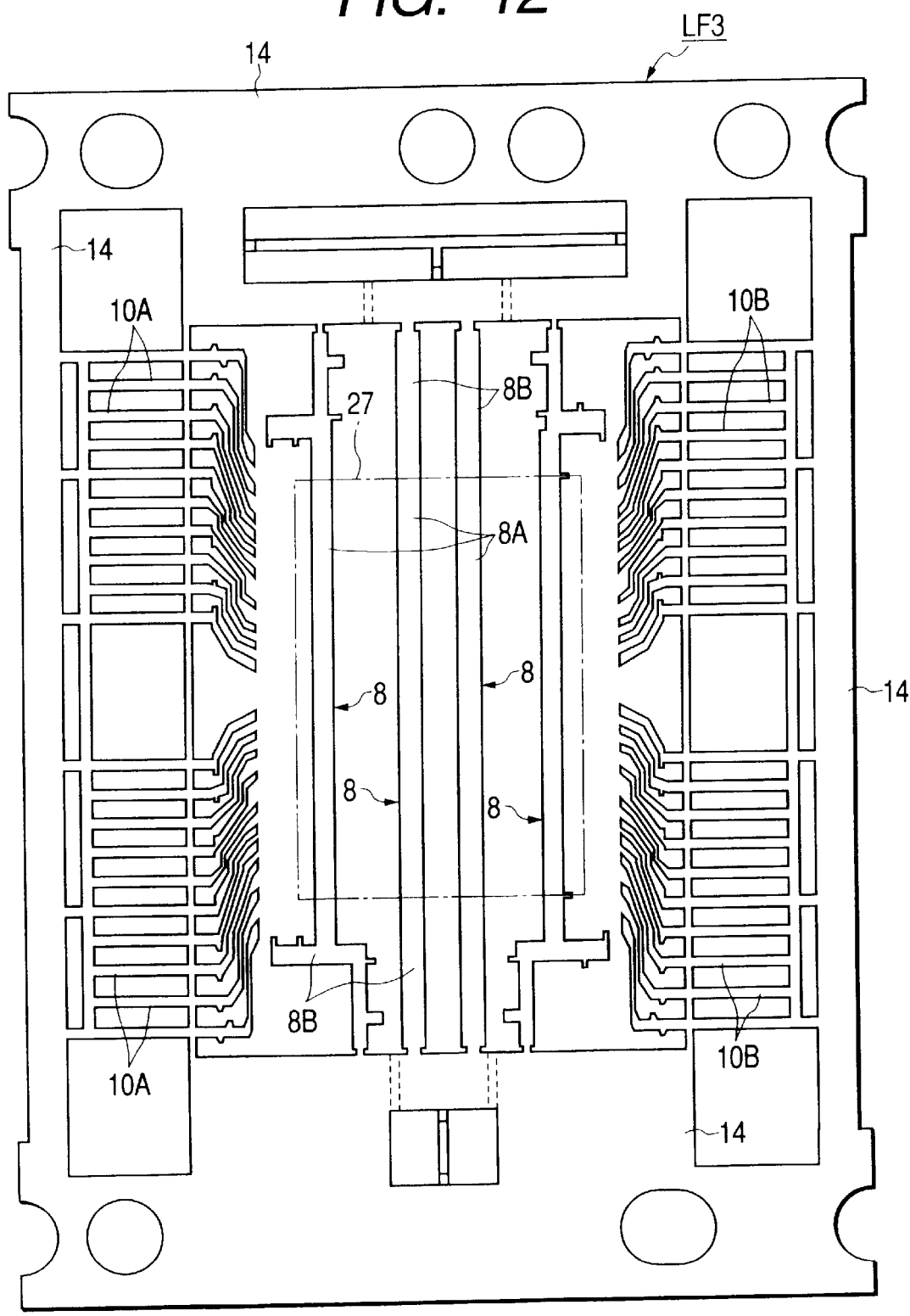
FIG. 12 is a typical plan showing a lead frame in a second transformed example of the first embodiment of the invention.

As shown in FIG. 12 (a typical sectional view), a lead frame LF3 provided with four supporting leads 8 may be also used. However, the respective first parts 8A of the four supporting leads 8 are required to be formed so that they respectively have smaller width than a value acquired by dividing the length of the shortest side of the respective sides of the chips 4 and 5 by the number of the supporting leads 8.

Second Embodiment

FIG. 13 is a typical sectional view showing a semiconductor device equivalent to a second embodiment of the invention.

As shown in FIG. 13, the semiconductor device 2 equivalent to this embodiment basically has the similar configuration to that in the first embodiment and is different from that in the following configuration.

That is, the rear surface of a chip 4 is bonded to a first part 8A of one supporting lead 8 via an adhesive layer 7 and the rear surface of a chip 5 is bonded to a first part 8A of the other supporting lead 8 via an adhesive layer 9. As resin more easily enters an area defined by the respective first parts of the two supporting leads 8 via between the rear surface of the chip 5 and the first part 8A of one supporting lead 8 and via between the rear surface of the chip 4 and the first part 8A of the other supporting lead 8 owing to such configuration when a resin sealing body 12 is formed, a void can be prevented from being caused when the resin sealing body 12 is formed. As a result, the yield of the semiconductor device can be further enhanced.

However, each thickness of the adhesive layers 7 and 9 is required to be set so that an interval between the rear surface of the chip 5 and the first part 8A of one supporting lead 8 and an interval between the rear surface of the chip 4 and the first part 8A of the other supporting lead 8 are respectively wider than a filler the largest in a particle diameter of fillers mixed in resin (sealing resin) used for forming the resin sealing body.

Third Embodiment

FIG. 14 is a typical sectional view showing a semiconductor device equivalent to a third embodiment of the invention.

As shown in FIG. 14, the semiconductor device 3 equivalent to this embodiment basically has the similar configuration to that in the first and second embodiments and is different in the following configuration.

That is, a first part 8A of a supporting lead 8 has a bonded part 8A1 bonded to the rear surface of a chip 4 via an adhesive layer 7 and a bonded part 8A2 bonded to the rear surface of a chip 5 via an adhesive layer 9. The supporting lead 8 is bent in a direction of the thickness of the chips 4 and 5 so that the respective positions of the bonded parts 8A1 and 8A2 are different.

As resin more easily enters an area defined by the respective first parts of the two supporting leads 8 via a part between the rear surface of the chip 5 and the bonded part 8A1 of the first part 8A of the supporting lead 8 and via a part between the rear surface of the chip 4 and the bonded part 8A2 of the first part 8A of the supporting lead 8 owing to such configuration when a resin sealing body 12 is formed, a void can be prevented from being caused when the resin sealing body 12 is formed. As a result, the yield of the semiconductor device can be further enhanced.

In a second chip bonding process for mounting the chip 5, as shock when the chip 5 is mounted on the first part 8A of the supporting lead 8 can be absorbed by the first part 8A of the supporting lead 8, the chips 4 and 5 can be respectively prevented from being cracked. As a result, the yield of the semiconductor device can be further enhanced.

Fourth Embodiment

Figure 15:
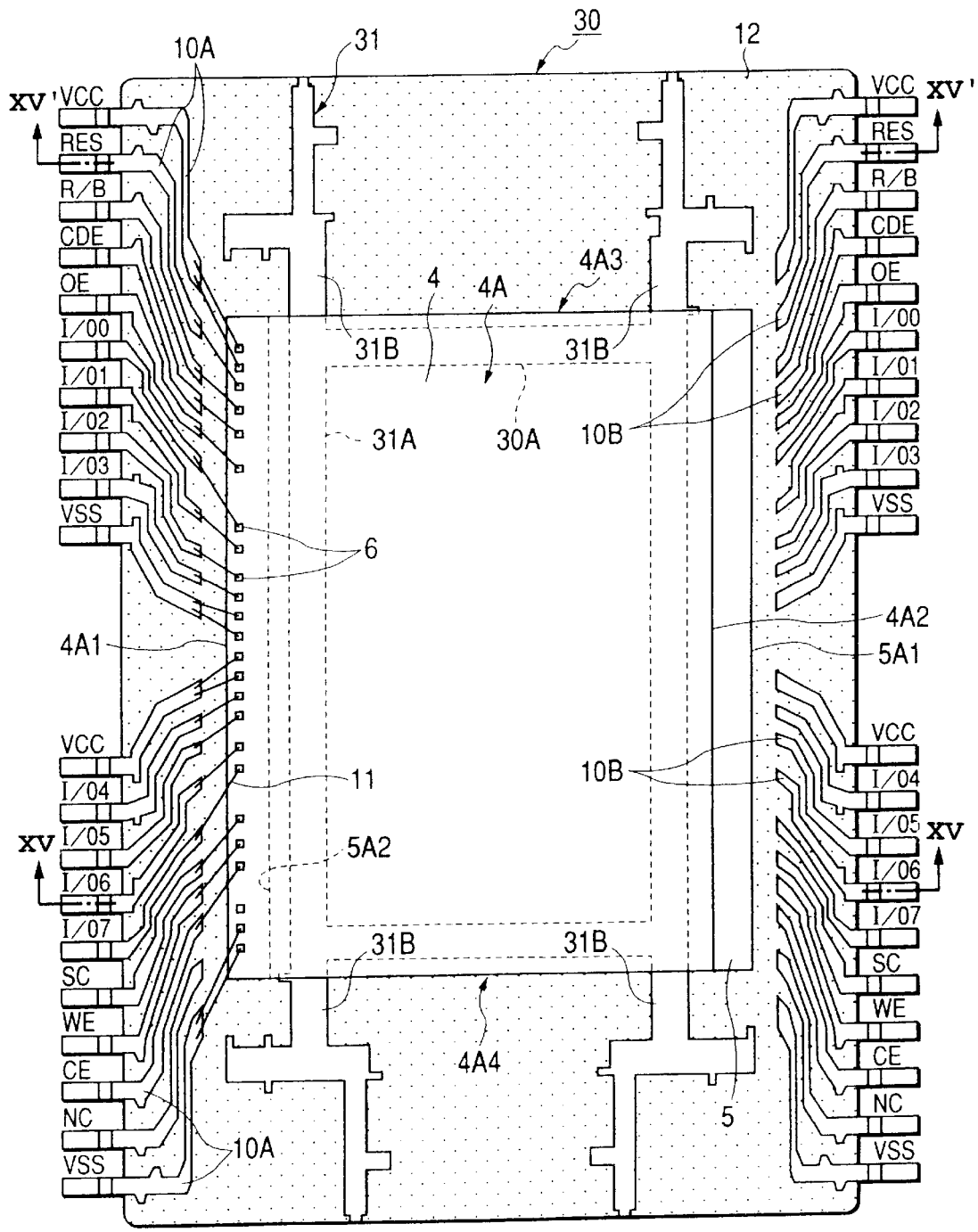
FIG. 15 is a typical plan showing a state that the upper part of a resin sealing body of a semiconductor device equivalent to a fourth embodiment of the invention is removed.

FIG. 15 is a typical plan showing a state that the upper part of a resin sealing body of a semiconductor device equivalent to a fourth embodiment of the invention is removed, FIGS. 16(a) and 16(b) are typical sectional views showing FIG. 15, in which FIG. 16 (a) is a sectional view viewed along a line XV—XV shown in FIG. 15 and FIG. 16(b) is a sectional view viewed along a line D—D in FIG. 15, and FIG. 17 is a typical plan showing a lead frame used for manufacturing the semiconductor device equivalent to this embodiment.

As shown in FIGS. 15 and 16, a semiconductor device 30 equivalent to this embodiment basically has the similar configuration to that in the first to third embodiments and is different in the following configuration.

That is, the semiconductor device 30 is provided with a supporting body 31. The supporting body 31 has a frame 31A arranged between the rear surface of a chip 4 and the rear surface of a chip 5 and four supporting leads 31B a part of each of which is arranged between the chips 4 and 5 and a part of each of which is integrated with the frame 31A. The frame 31A is formed so that the outline size is smaller than the respective outline sizes of the chips 4 and 5 and a part of each of the four supporting leads 31B is formed so that it has smaller width than a value acquired by dividing the length of the shortest side of the respective sides of the chips 4 and 5 by the number of the leads. The similar effect to that in the first embodiment is acquired owing to such configuration.

As shown in FIGS. 16(b) and 17, the frame 31A has a groove 32 pierced from the inside to the outside of the frame. As resin can be injected into the inside of the frame 31A between the chips 4 and 5 by such configuration when a resin sealing body 12 is formed, the chips 4 and 5 can be supported by the frame 31A arranged between them.

Fifth Embodiment

Figure 18:
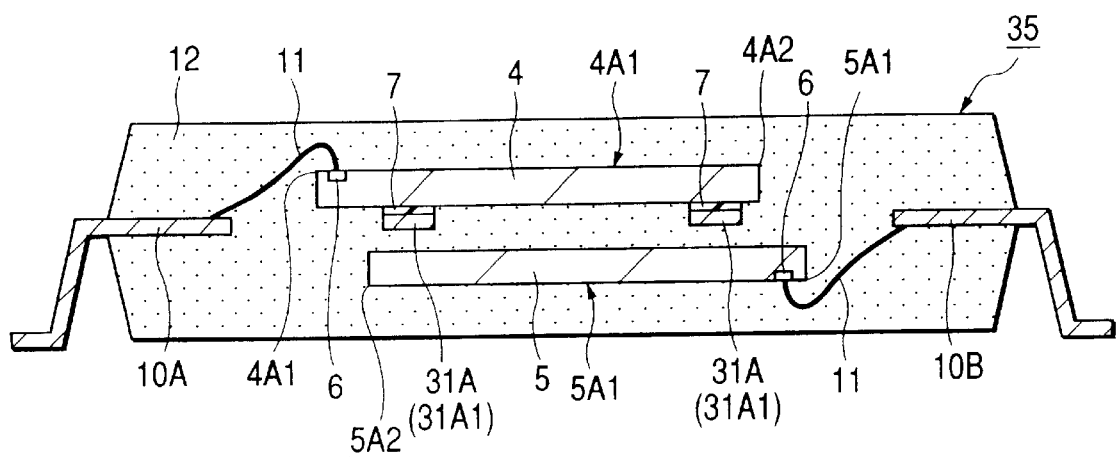
FIG. 18 is a typical sectional view showing a semiconductor device equivalent to a fifth embodiment of the invention.
Figure 19:
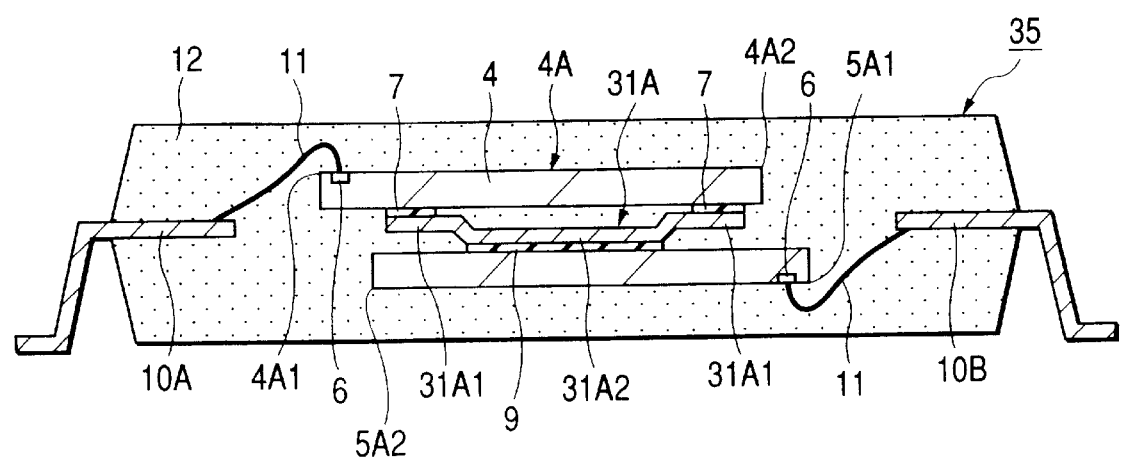
FIG. 19 is a typical sectional view showing the semiconductor device equivalent to the fifth embodiment of the invention.
Figure 20:
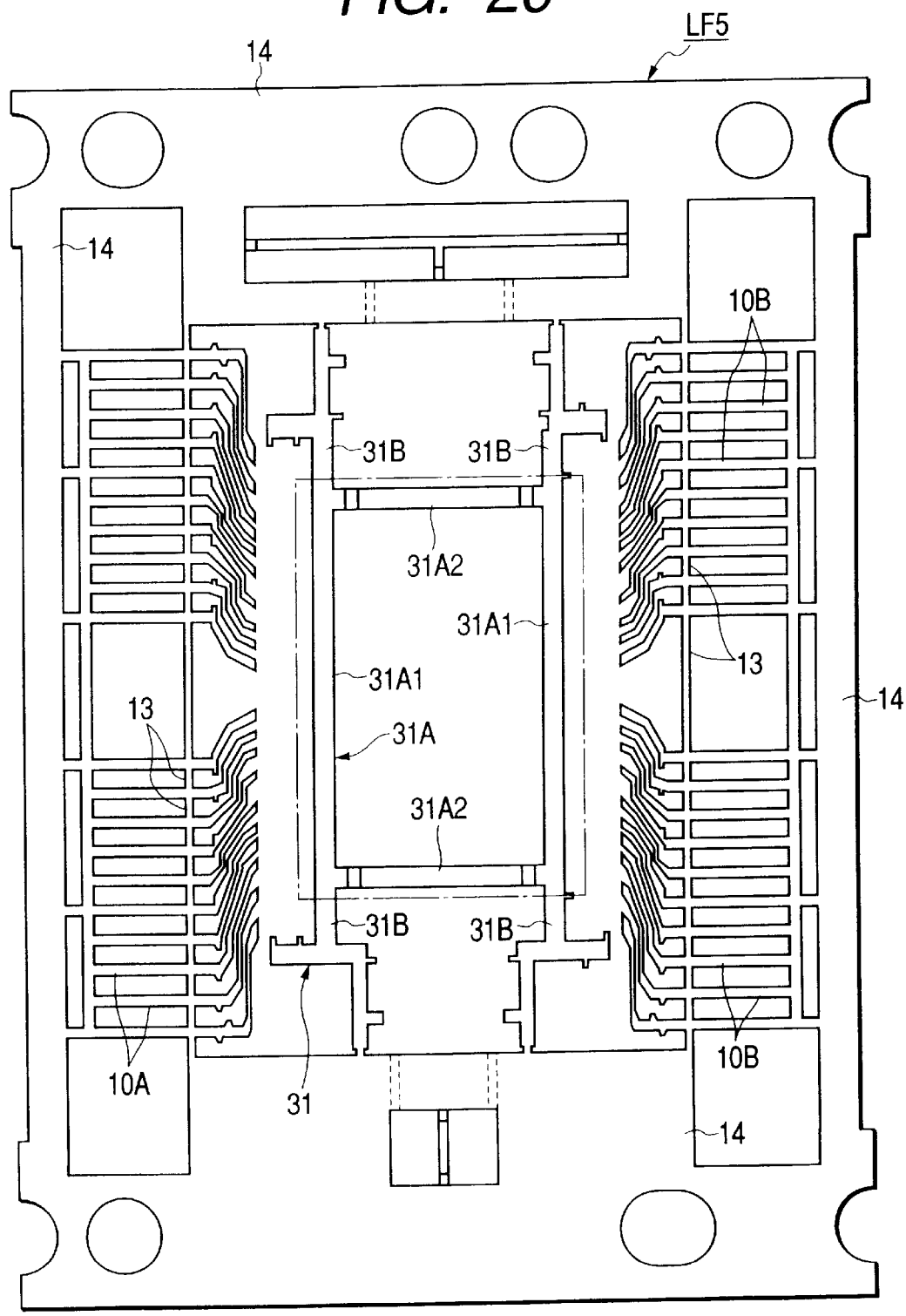
FIG. 20 is a typical plan showing a lead frame used for manufacturing the semiconductor device equivalent to the fifth embodiment of the invention.

FIGS. 18 and 19 are typical sectional views showing a semiconductor device equivalent to a fifth embodiment of the invention and FIG. 20 is a typical plan showing a lead frame used for manufacturing the semiconductor device equivalent to this embodiment.

As shown in FIGS. 18 to 20, the semiconductor device 35 equivalent to this embodiment basically has the similar configuration to that in the fourth embodiment and is different from that in the fourth embodiment in the following configuration.

That is, a frame 31A has a bonded part 31A1 bonded to the rear surface of a chip 4 via an adhesive layer 7 and a bonded part 31A2 bonded to the rear surface of a chip 5 via an adhesive layer 9. The frame 31A is bent in a direction of the thickness of the semiconductor chips 4 and 5 so that the respective positions of the bonded parts 31A1 and 31A2 are different.

As resin can be injected into the inside of the frame 31A between the chips 4 and 5 via between the rear surface of the chip 5 and the bonded part 31A1 of the frame 31A and via between the rear surface of the chip 4 and the bonded part 31A2 of the frame 31A by such configuration when a resin sealing body 12 is formed, the chips 4 and 5 can be supported by the frame 31A arranged between them.

In a second chip bonding process for mounting the chip 5, as shock when the chip 5 is mounted can be absorbed by the elastic deformation of the frame 31A, the chips 4 and 5 can be prevented from being cracked. As a result, the yield of the semiconductor device can be further enhanced.

Sixth Embodiment

Figure 21:
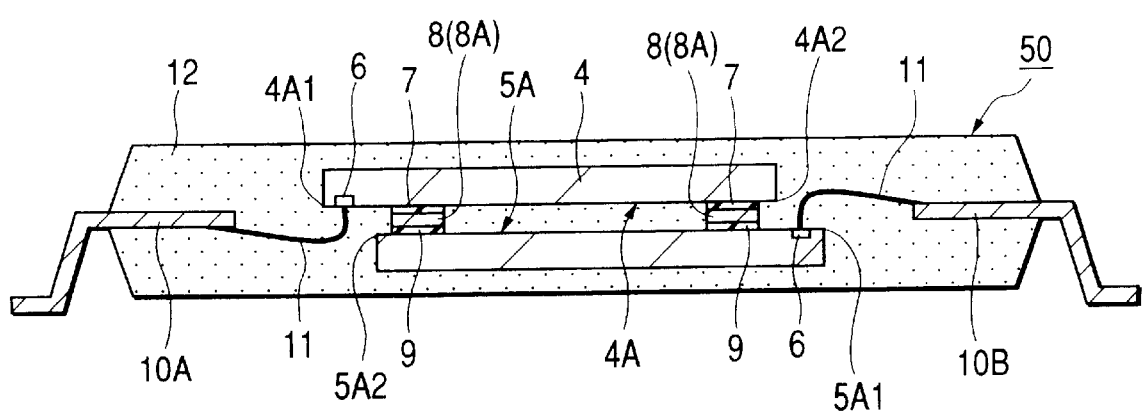
FIG. 21 is a typical sectional view showing a semiconductor device equivalent to a sixth embodiment of the invention.

FIG. 21 is a typical sectional view showing a semiconductor device equivalent to a sixth embodiment of the invention.

As shown in FIG. 21, a semiconductor device 50 equivalent to this embodiment basically has the similar configuration to that in the first embodiment and is different from that in the first embodiment in the following configuration.

That is, chips 4 and 5 are laminated in a state that the respective circuit forming surfaces 4A and 5A are opposed so that one longer side 4A1 of the chip 4 and the other longer side 5A2 of the chip 5 are located on the side of the lead 10A and in a state that the respective positions are off so that an electrode 6 of the chip 4 is located outside the other longer side 5A2 of the chip 5 and an electrode 6 of the chip 5 is located outside the other longer side 4A2 of the chip 4.

The semiconductor device 50 equivalent to this embodiment is manufactured using the lead frame LF1 shown in FIG. 6. Referring to FIGS. 22 and 23 (typical sectional views for explaining the manufacture), the manufacture of the semiconductor device 50 will be described below.

Figure 22A:
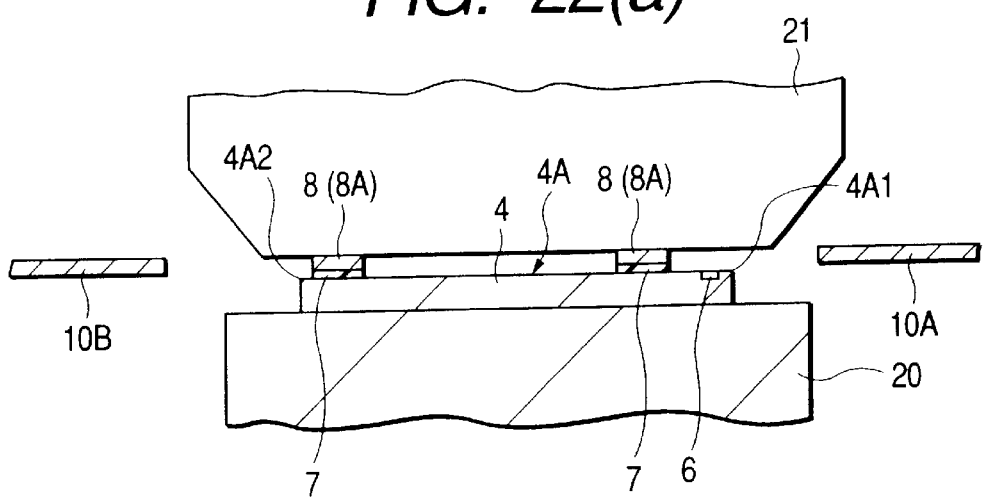
FIGS. 22(a) to 22(c) are typical sectional views for explaining the manufacture of the semiconductor device equivalent to the sixth embodiment of the invention.

First, one chip 4 is bonded and fixed to the lead frame LF1. The lead frame LF1 and the chip 4 are fixed by mounting the chip 4 on a heat stage 20 in a state that the heat stage 20 and the rear surface of the chip 4 are opposite as shown in FIG. 22(a), afterward forming an adhesive layer 7 on the circuit forming surface 4A of the chip 4 by applying a paste adhesive by the multipoint application method for example and afterward thermo-compression bonding a first part 8A of a supporting lead 8 to the circuit forming surface 4A of the chip 4 by a bonding tool 21. At this time, the chip 4 is fixed so that one longer side 4A1 of the chip 4 is located on the side of the lead 10A (one group of leads of two opposite lead groups).

Figure 22B:
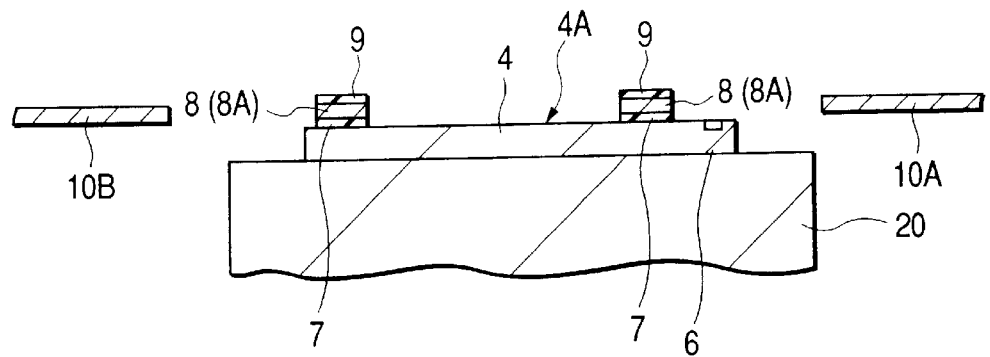
Figure 22C:
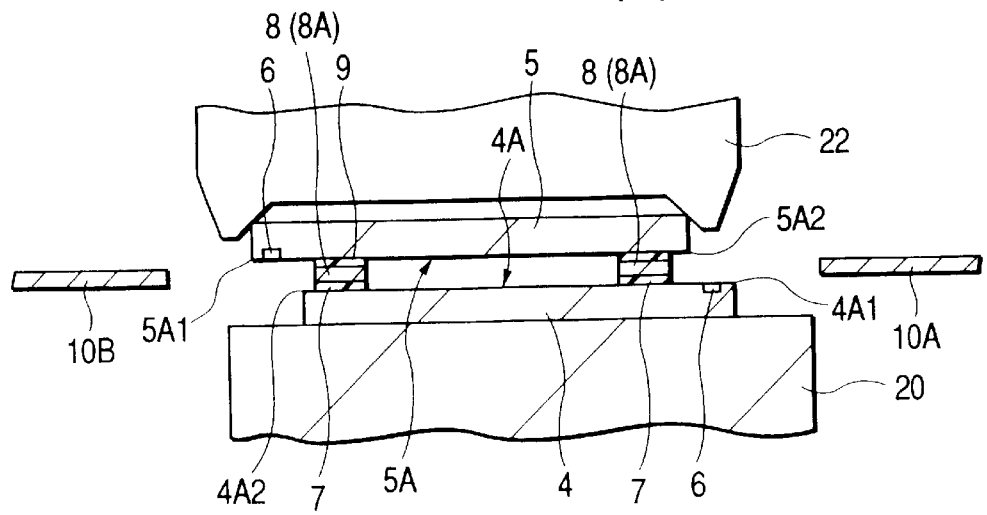

Next, the other chip 5 is bonded and fixed to the lead frame LF1. The lead frame LF1 and the chip 5 are fixed by forming an adhesive layer 9 by applying a paste adhesive for example to the first part 8A of the supporting lead 8 by the multipoint application method as shown in FIG. 22(b) and afterward thermo-compression bonding the chip 5 to the first part 8A of the supporting lead 8 in a state that the circuit forming surface 4A of the chip 4 and the circuit forming surface 5A of the chip 5 are opposite as shown in FIG. 22(c) by a bonding tool 22. At this time, the chip 5 is fixed so that one longer side 5A1 of the chip 5 is located on the side of the lead 10B (the other group of leads of two opposite lead groups). The chips are fixed in a state that the respective positions are off (in state that the respective positions are off in a direction in which one longer side 4A1 of the chip 4 and one longer side 5A1 of the chip 5 mutually go away) so that the electrode 6 of the chip 4 is located outside the other longer side 5A2 of the chip 5 and the electrode 6 of the chip 5 is located outside the other longer side 4A2 of the chip 4.

Figure 23D:
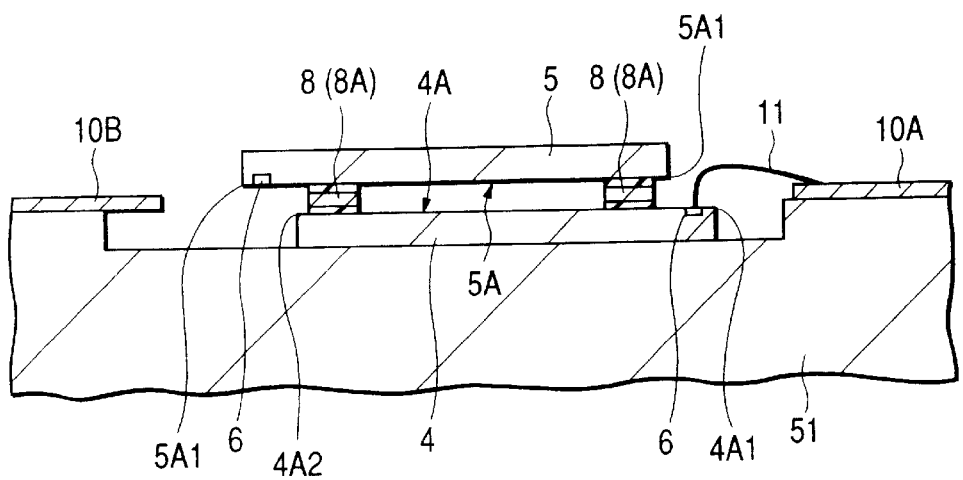
FIGS. 23(d) and 23(e) are typical sectional views for explaining the manufacture of the semiconductor device equivalent to the sixth embodiment of the invention.

Next, the electrode 6 of the chip 4 and an inner part of the lead 10A are electrically connected via conductive wire 11. The electrode 6 of the chip 4 and the inner part of the lead 10A are connected by mounting the lead frame LF1 on a heat stage 51 in a state that the heat stage 51 and the rear surface of the chip 4 are opposite as shown in FIG. 23(d).

In this process, as the chips 4 and 5 are laminated in a state that the respective circuit forming surfaces 4A and 5A are opposite, the rear surface of the chip 5 can be directly touched to the heat stage 51. Therefore, as the heat of the heat stage 51 is effectively transmitted to the electrode 6 of the chip 4, a failure of connection between the electrode 6 of the chip 4 and the wire 11 can be reduced.

Also, as the chips 4 and 5 are laminated in a state that the respective circuit forming surfaces 4A and 5A are opposite, a part or the whole of the height of a loop of the wire 11 electrically connecting the electrode 6 of the chip 4 and the lead 10A is offset by the thickness of the chip 5.

Figure 23E:
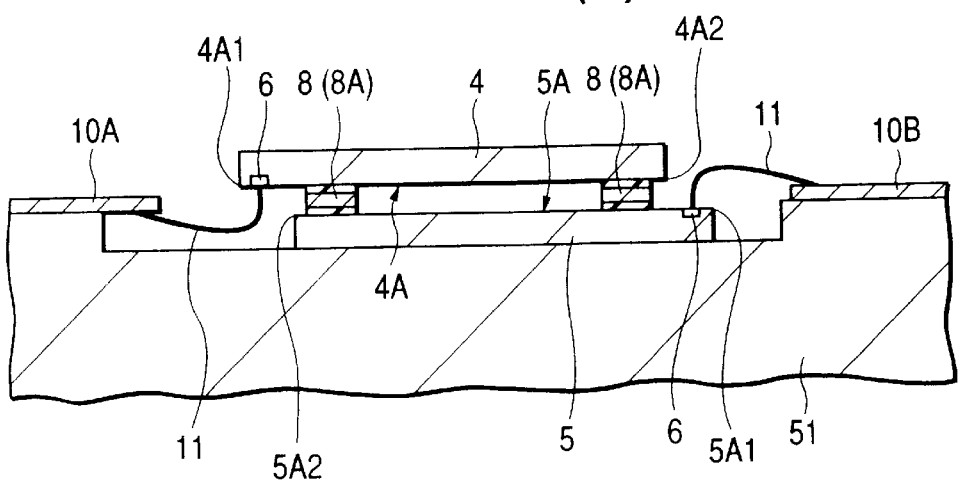

Next, after the lead frame LF1 is reversed so that the rear surface of the chip 4 is directed upward, the electrode 6 of the chip 5 and an inner part of the lead 10B are electrically connected via conductive wire 11. The electrode 6 of the chip 5 and the inner part of the lead 10B are connected by mounting the lead frame LF1 on the heat stage 51 in a state that the heat stage 51 and the rear surface of the chip 5 are opposite as shown in FIG. 23(e).

In this process, as the chips 4 and 5 are laminated in a state that the respective circuit forming surfaces 4A and 5A are opposite, the rear surface of the chip 5 can be directly touched to the heat stage 51. Therefore, as the heat of the heat stage 51 is effectively transmitted to the electrode 6 of the chip 5, a failure of connection between the electrode 6 of the chip 5 and the wire 11 can be reduced.

Also, as the chips 4 and 5 are laminated in a state that the respective circuit forming surfaces 4A and 5A are opposite, a part or the whole of the height of a loop of wire 11 electrically connecting the electrode 6 of the chip 5 with the lead 10B is offset by the thickness of the chip 4.

Afterward, the semiconductor device 50 shown in FIG. 21 is substantially completed by executing the similar process to that in the first embodiment.

In a resin sealing body forming process (a sealing process) in this embodiment, as a part or the whole of the height of the loop of the wire 11 electrically connecting the electrode 6 of the chip 4 and the lead 10A is offset by the thickness of the chip 5 and a part or the whole of the height of the loop of the wire 11 electrically connecting the electrode 6 of the chip 5 and the lead 10B is offset by the thickness of the chip 4, the thickness of the resin of the resin sealing body 12 on the rear surface of the chip 4 can be reduced and the thickness of the resin of the resin sealing body 12 on the rear surface of the chip 5 can be reduced.

As described above, according to this embodiment, the following effect is acquired.

(1) In the semiconductor device 50, the chips 4 and 5 are laminated in a state that the respective circuit forming surfaces 4A and 5A are opposed so that one longer side 4A1 of the chip 4 and the other longer side 5A2 of the chip 5 are located on the side of the lead 10A and in a state that the respective positions are off (in a state that the respective positions are off in a direction in which one longer side 4A1 of the chip 4 and one longer side 5A1 of the chip 5 mutually go away) so that the electrode 6 of the chip 4 is located outside the other longer side 5A2 of the chip 5 and the electrode 6 of the chip 5 is located outside the other longer side 4A2 of the chip 4.

As owing to such configuration, a part or the whole of the height of the loop of the wire 11 electrically connecting the electrode 6 of the chip 4 and the lead 10A is offset by the thickness of the chip 5 and a part or the whole of the height of the loop of the wire 11 electrically connecting the electrode 6 of the chip 5 and the lead 10B is offset by the thickness of the chip 4, the thickness of the resin of the resin sealing body 12 on the circuit forming surface 4A of the chip 4 and the thickness of the resin of the resin sealing body 12 on the circuit forming surface 5A of the chip 5 can be reduced. As a result, as the whole thickness of the whole resin sealing body 12 can be reduced, the semiconductor device can be thinned.

(2) In the semiconductor device 50, the chips 4 and 5 are laminated via the first part 8A of the supporting lead 8 between the circuit forming surface 4A of the chip 4 and the circuit forming surface 5A of the chip 5.

As owing to such configuration, an interval between the circuit forming surface 4A of the chip 4 and the circuit forming surface of the chip 5 is widened, a problem that the circuit of the other chip malfunctions by the effect of noise caused when the circuit of one chip is operated can be inhibited. As a result, the thin type semiconductor device the electric reliability of which is high can be provided.

Figure 24:
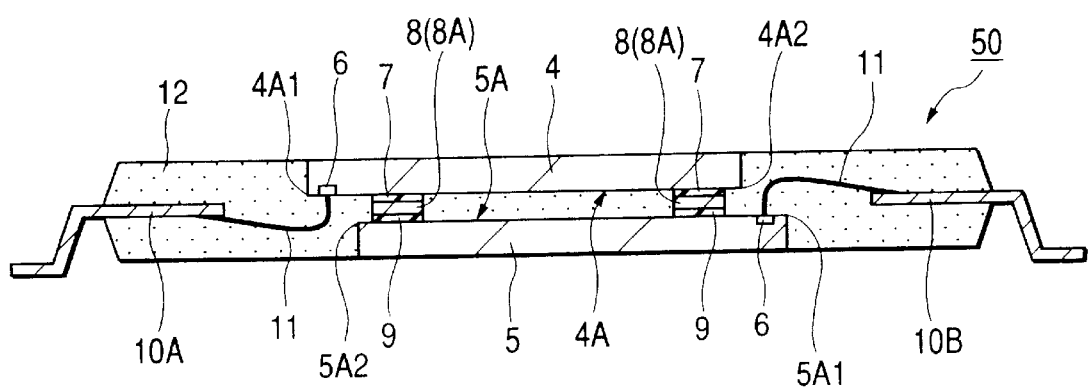
FIG. 24 is a typical sectional view showing a semiconductor device in a transformed example of the sixth embodiment of the invention.

In this embodiment, the chips 4 and 5 are laminated in a state that the respective circuit forming surfaces 4A and 5A are opposite. Therefore, as shown in FIG. 24 (a typical sectional view), the respective circuit forming surfaces 4A and 5A of the chips 4 and 5 may be also exposed from the resin sealing body 12. In this case, as heat caused by the circuit operation of the two chips is more easily radiated outside, the semiconductor device excellent in outgoing radiation can be provided. However, to have such configuration, the height of the loop of the wire 11 is required to be reduced and the wire is required to be prevented from being protruded from the rear surface of the chip. The loop of the wire 11 can be lowered by positioning the surface of the lead 10A on which it is connected to the wire on the side of the chip 5 instead of the side of the rear surface of the chip 4 and positioning the surface of the lead 10B on which it is connected to the wire on the side of the chip 4 instead of the side of the rear surface of the chip 5.

Seventh Embodiment

Figure 25:
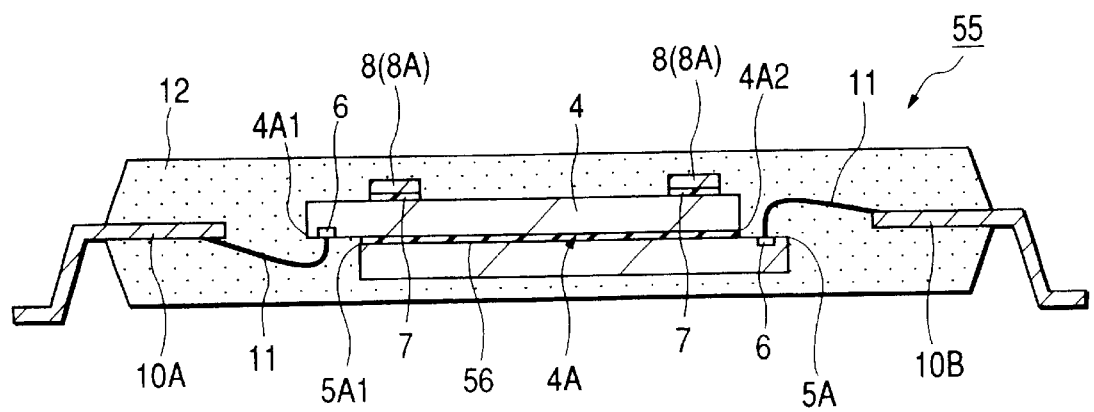
FIG. 25 is a typical sectional view showing a semiconductor device equivalent to a seventh embodiment of the invention.

FIG. 25 is a typical sectional view showing a semiconductor device equivalent to a seventh embodiment of the invention.

As shown in FIG. 25, a semiconductor device 55 equivalent to this embodiment basically has the similar configuration to that in the sixth embodiment and is different from that in the sixth embodiment in the following configuration.

That is, chips 4 and 5 are laminated in a state that the respective circuit forming surfaces 4A and 5A are mutually bonded via an adhesive layer 56. Also, the respective first parts 8A of two supporting leads 8 are bonded to the rear surface of the chip 4 via an adhesive layer 7. In such configuration, as in the sixth embodiment, the semiconductor device can be also thinned. However, as an interval between the circuit forming surface 4A of the chip 4 and the circuit forming surface 5A of the chip 5 is narrow, a problem that the circuit of the other chip malfunctions by the effect of noise caused in the circuit operation of one chip is easily caused.

Figure 26:
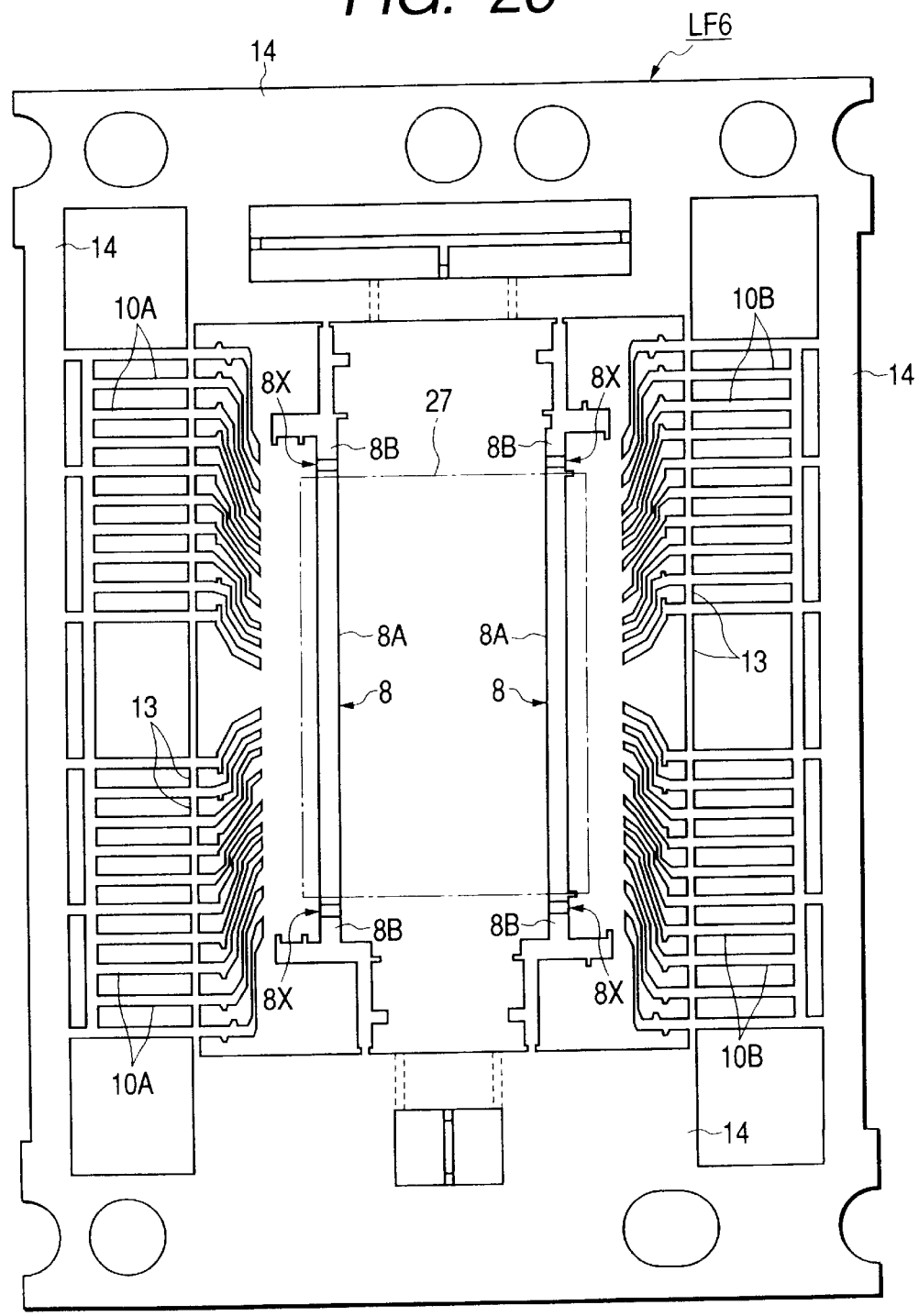
FIG. 26 is a typical plan showing a lead frame used for manufacturing the semiconductor device equivalent to the seventh embodiment of the invention.

The semiconductor device 55 equivalent to this embodiment is manufactured in a manufacturing process using a lead frame LF6 shown in FIG. 26 (a typical plan). The lead frame LF6 basically has the similar configuration to that of the lead frame LF1, however, bending for positioning the first part 8A of the supporting lead 8 on the rear surface of the chip 4 is applied to a part 8X of a second part 8B of the supporting lead 8.

In the manufacture of the semiconductor device 55, first, the chip 4 is bonded and fixed to the lead frame LF6. The lead frame LF6 and the chip 4 are fixed by mounting the chip 4 on a heat stage in a state that the heat stage and the circuit forming surface 4A of the chip 4 are opposite, afterward forming the adhesive layer 7 by applying a paste adhesive for example to the rear surface of the chip 4 by the multipoint application method and afterward thermocompression bonding the first part 8A of the supporting lead 8 to the rear surface of the chip 4 by a bonding tool. At this time, the chip 4 is fixed so that one longer side 4A1 of the chip 4 is located on the side of a lead 10A (one group of leads of two opposite lead groups).

Next, the chip 5 is bonded and fixed to the chip 4. The chips 4 and 5 are fixed by forming an adhesive layer 56 by applying a paste adhesive for example to the rear surface of the chip 4 by the multipoint application method after the lead frame LF6 is reversed so that the circuit forming surface 4A of the chip 4 is directed upward and afterward thermocompression bonding the chip 5 to the chip 4 in a state that the rear surface of the chip 4 and the rear surface of the chip 5 are opposite by a bonding tool. At this time, the chip 5 is fixed so that one longer side 5A1 of the chip 5 is located on the side of a lead 10B (the other group of leads of the two opposite lead groups). Also, the chips 4 and 5 are fixed in a state that the respective positions are off so that an electrode 6 of the chip 4 is located outside the other longer side 5A2 of the chip 5 and an electrode 6 of the chip 5 is located outside the other longer side 4A2 of the chip 4.

Next, the electrode 6 of the chip 4 and an inner part of the lead 10A are electrically connected via conductive wire 11 and the electrode 6 of the chip 5 and an inner part of the lead 10B are electrically connected via conductive wire 11.

Afterward, the semiconductor device 55 shown in FIG. 25 is substantially completed by executing the similar process to that in the first embodiment.

In this embodiment, the example that the first part 8A of the supporting lead 8 is bonded to the rear surface of the chip 4 is described, however, the first part 8A of the supporting lead 8 may be also bonded to the rear surface of the chip 5.

Eighth Embodiment

Figure 27:
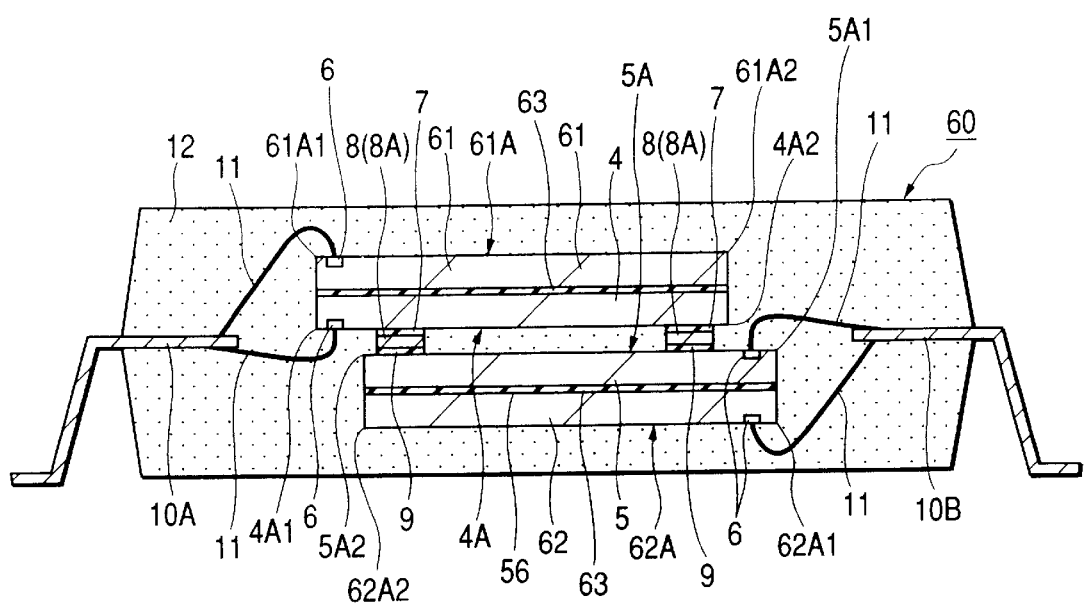
FIG. 27 is a typical sectional view showing a semiconductor device equivalent to an eighth embodiment of the invention.

FIG. 27 is a typical sectional view showing a semiconductor device equivalent to an eighth embodiment of the invention.

As shown in FIG. 27, a semiconductor device 60 equivalent to this embodiment has configuration that four chips 4, 5, 61 and 62 are laminated and are sealed by one resin sealing body 12.

The chips 4 and 5 are laminated in a state that the respective circuit forming surfaces 4A and SA are opposed so that one longer side 4A1 of the chip 4 and the other longer side 5A2 of the chip 5 are located on the side of a lead 10A and the respective positions are off so that an electrode 6 of the chip 4 is located outside the other longer side 5A2 of the chip 5 and an electrode 6 of the chip 5 is located outside the other longer side 4A2 of the chip 4 as in the sixth embodiment. Also, the chips 4 and 5 are respectively bonded to the respective first parts 8A of two supporting leads 8 arranged between the respective circuit forming surfaces 4A and 5A as in the sixth embodiment.

The chips 61 and 62 are formed according to a mirror inverting circuit pattern for the chips 4 and 5. The chips 4 and 61 are laminated in a state that the respective rear surfaces are opposed so that one longer sides 4A1 and 61A1 of the respective circuit forming surfaces 4A and 61A are located on the side of the lead 10A and the other longer sides 4A2 and 61A2 of the respective circuit forming surfaces 4A and 61A are located on the side of the lead 10B, and the respective rear surfaces are mutually bonded via an adhesive layer 63. The respective electrodes 6 of the chips 4 and 61 are electrically connected to the lead 10A via the wire 11.

The chips 5 and 62 are laminated in a state that the respective rear surfaces are opposed so that one longer sides 5A1 and 62A1 of the respective circuit forming surfaces 5A and 62A are located on the side of the lead 10B and the other longer sides 5A2 and 62A2 of the respective circuit forming surfaces 5A and 62A are located on the side of the lead 10A, and the respective rear surfaces are mutually bonded via an adhesive layer 63. The respective electrodes 6 of the chips 5 and 62 are electrically connected to the lead 10B via the wire 11.

In such configuration, as sealing resin also more easily gets in between the circuit forming surface 4A of the chip 4 and the circuit forming surface 5A of the chip 5 when the resin sealing body 12 is formed, a void caused between the chips 4 and 5 due to the respective warps of the chips 4 and 5 can be inhibited. As a result, the yield of the semiconductor device can be enhanced as in the first embodiment.

Ninth Embodiment

Figure 28A:
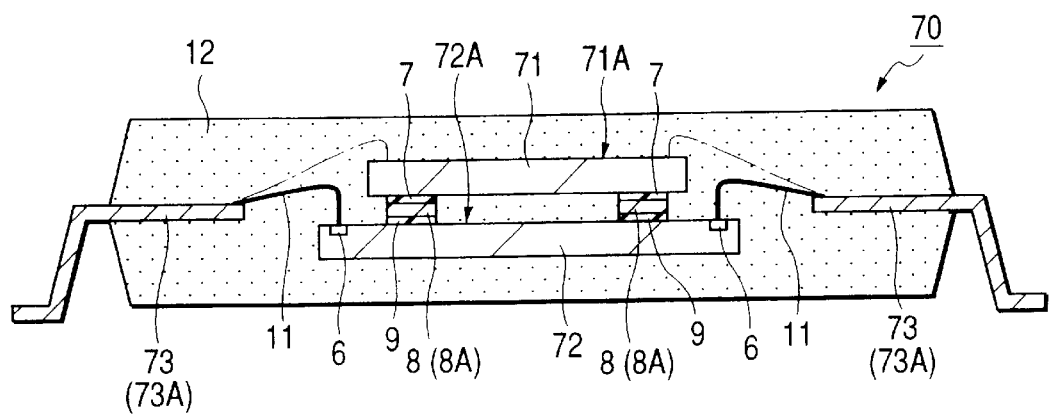
FIGS. 28(a) and 28(b) are typical sectional views showing a semiconductor device equivalent to a ninth embodiment of the invention.
Figure 28B:
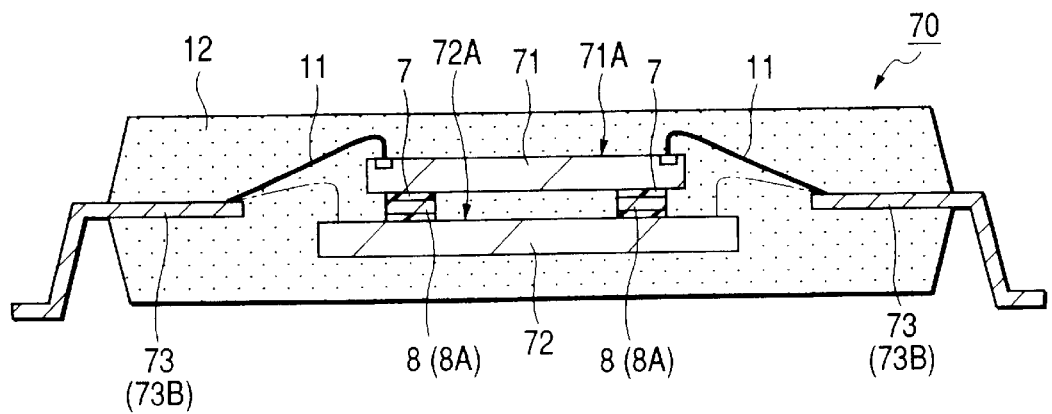
Figure 29A:
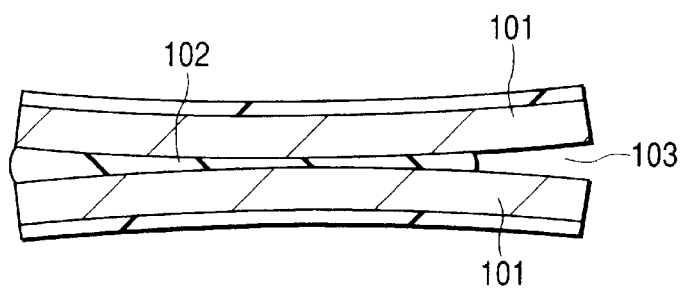
FIGS. 29(a) and 29(b) are typical sectional views for explaining the problem solved by the invention of prior art.
Figure 29B:
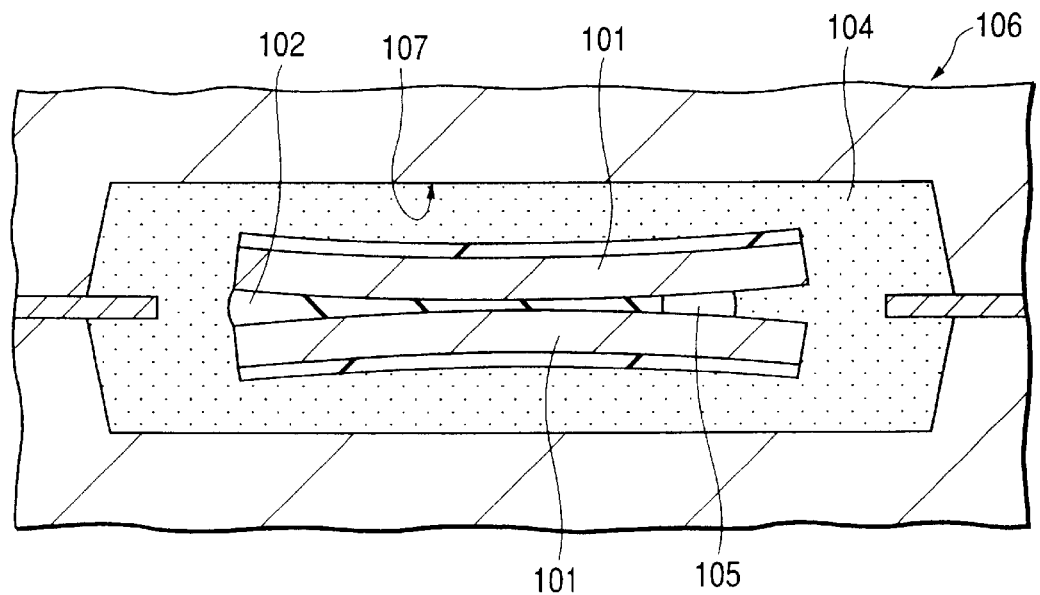

FIG. 28 is a typical sectional view showing a semiconductor device equivalent to a ninth embodiment of the invention.

As shown in FIG. 28, a semiconductor device 70 equivalent to this embodiment has configuration that the two chips 71 and 72 different in the outline size are laminated and are sealed by one resin sealing body 12.

The respective planar forms of the chips 71 and 72 are formed in a square. In this embodiment, the chip 71 is formed in a square of 7.21 mm×7.21 mm for example and the chip 72 is formed in a rectangle of 11.59 mm×8.38 mm for example.

Plural electrodes 6 arranged along the respective sides are formed on each side of the circuit forming surface 71A of the chip 71. Plural electrodes 6 arranged along the respective longer sides are formed on the side of the two longer sides mutually opposite of the circuit forming surface 72A of the chip 72. A 256-Mbit flash memory for example for a storage circuit is built in the chip 72. A control circuit for controlling the storage circuit of the chip 72 for example is built in the chip 71.

The planar form of a resin sealing body 12 is formed in a square. In this embodiment, the planar form of the resin sealing body 12 is formed in a rectangle of 20 mm×14 mm for example.

Plural leads 73 arranged along each side of the resin sealing body 12 are arranged outside the periphery of the chip 71. Each of the plural leads 73 has an inner part located inside the resin sealing body 12 and an outer part located outside the resin sealing body 12. Each outer part of the plural leads 73 is bent in a gull's wing type lead form for example which is one of surface mounting type lead forms. That is, the semiconductor device 70 equivalent to this embodiment is formed in a quad flatpack package (QFP) type which is four-direction lead array structure.

An inner part of a lead 73A of the plural leads 73 is electrically connected to an electrode 6 of the chip 72 via conductive wire 11 and an inner part of a lead 73B is electrically connected to an electrode 6 of the chip 71 via conductive wire 11.

The chip 71 is arranged on the circuit forming surface 72A of the chip 72 in a state that the rear surface is opposite to the circuit forming surface 72A of the chip 72. The respective first parts 8A of two supporting leads 8 are inserted between the chips 71 and 72 as in the first embodiment. The rear surface of the chip 71 is bonded to the respective first parts 8A of the two supporting leads 8 via an adhesive layer 7. The circuit forming surface 72A of the chip 72 is bonded to the respective first parts 8A of the two supporting leads 8 via an adhesive layer 9. The respective first parts 8A of the two supporting leads 8 are respectively formed so that each first part has smaller width than a value acquired by dividing the length of the shortest side out of four sides of each of the two chips 71 and 72 by the number of the supporting leads 8.

In the semiconductor device 70 configured as described above, as sealing resin also more easily gets in between the rear surface of the chip 71 and the circuit forming surface 72A of the chip 72 when the resin sealing body 12 is formed, a void caused between the chips 71 and 72 due to the respective warps of the chips 71 and 72 can be inhibited. As a result, the yield of the semiconductor device can be enhanced as in the first embodiment.

The invention made by these inventors is concretely described based upon the embodiments, however, it need scarcely be said that the invention is not limited to the embodiments and can be variously varied in a range in which the summary does not deviate.

For example, the invention can be applied to semiconductor devices of a small outline J-leaded package (SOJ) type which is two-direction lead array structure, a small outline package (SOP) type and the like.

Also, the invention can be applied to semiconductor devices of a quad flatpack J-leaded package (QFJ) type which is four-direction lead array structure and the like.

What is claimed is:

1. A semiconductor device, comprising:
   a first semiconductor chip and a second semiconductor chip laminated with respective first main surfaces opposite to each other;
   a single lead frame having a plurality of signal leads each having an inner lead and an outer lead, the inner leads of the plurality of signal leads being arranged at the vicinity of one pair of opposed edges of the first and second semiconductor chips;
   a supporting lead, a part of which is arranged between the first main surface of the first semiconductor chip and the first main surface of the second semiconductor chip, the first and second semiconductor chips being disposed to have a space between the first main surfaces of the first and second semiconductor chips and being supported by the supporting lead; and
   a resin sealing body that seals the first semiconductor chip, the second semiconductor chip, the inner leads of the plurality of signal leads, and the supporting lead, the outer leads of the plurality of signal leads protruding outwardly from the resin sealing body, wherein:
      the respective first main surfaces of the first semiconductor chip and the second semiconductor chip are bonded to a part of the supporting lead via an adhesive layer;
      a part of the supporting lead is formed so that it has a smaller width than the respective sides of the first semiconductor chip and the second semiconductor chip; and
      a part of the resin sealing body is formed in the space between the first main surfaces of the first and second semiconductor chips.

2. A semiconductor device according to claim 1, wherein:
   the first semiconductor chip and the second semiconductor chip are formed in the same outline size.

3. A semiconductor device according to claim 1, wherein:
   a part of the supporting lead has a first part bonded to one main surface of the first semiconductor chip via an adhesive layer and a second part bonded to one main surface of the second semiconductor chip via an adhesive layer; and
   the respective first and the second parts are different from each other in a direction of the thickness of the semiconductor chip.

4. A semiconductor device according to claim 2, wherein:
   the first semiconductor chip is provided with plural electrodes on the other main surface opposite to the one main surface; and
   the second semiconductor chip is provided with plural electrodes on the other main surface opposite to the one main surface.

5. A semiconductor device according to claim 2, wherein:
   the first semiconductor chip is provided with plural electrodes arranged along a first side on the side of the first side of opposite first side and second side of the one main surface;
   the second semiconductor chip is provided with plural electrodes arranged along a first side on the side of the first side of opposite first side and second side of the one main surface; and
   the first semiconductor chip and the second semiconductor chip are bonded in a state that the respective one main surfaces are opposed so that the second side of the second semiconductor chip is located on the side of the first side of the first semiconductor chip, the electrode of the second semiconductor chip is located outside the second side of the first semiconductor chip and the electrode of the first semiconductor chip is located outside the second side of the second semiconductor chip.

6. A semiconductor device according to claim 1, wherein:
   the first semiconductor chip is provided with plural electrodes on the other main surface opposite to the first main surface thereof; and
   the second semiconductor chip is provided with plural electrodes on the other main surface opposite to the first main surface thereof.

7. A semiconductor device according to claim 1, wherein:
   the first semiconductor chip is provided with plural electrodes on the other main surface opposite to the first main surface thereof and is formed in smaller outline size than that of the second semiconductor chip; and
   the second semiconductor chip is provided with plural electrodes on the first main surface thereof.

8. A semiconductor device according to claim 1, wherein the supporting lead extends outwardly from the other of pair of opposed edges of the first and second semiconductor chips.

9. A semiconductor device according to claim 1, wherein the resin sealing body includes a silica filler as an additive, and wherein a thickness of the supporting lead is larger than a grain size of the silica filler.

10. A semiconductor device according to claim 1, wherein a further supporting lead is formed between the first and second semiconductor chips, and wherein the two supporting leads extend along the one pair of opposed edges of the first and second semiconductor chips respectively.

* * * * *